(12) United States Patent
Wang et al.

(10) Patent No.: US 11,942,435 B2
(45) Date of Patent: Mar. 26, 2024

(54) SEMICONDUCTOR PACKAGE AND METHOD

(71) Applicant: Taiwan Semiconductor Manufacturing Co., Ltd., Hsinchu (TW)

(72) Inventors: Po-Han Wang, Hsinchu (TW); Hung-Jui Kuo, Hsinchu (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/302,461

(22) Filed: Apr. 18, 2023

(65) Prior Publication Data

US 2023/0253338 A1 Aug. 10, 2023

Related U.S. Application Data

(60) Continuation of application No. 17/129,067, filed on Dec. 21, 2020, now Pat. No. 11,664,323, which is a
(Continued)

(51) Int. Cl.
*H01L 21/48* (2006.01)
*H01L 21/288* (2006.01)
(Continued)

(52) U.S. Cl.
CPC ...... *H01L 23/5389* (2013.01); *H01L 21/2885* (2013.01); *H01L 21/4857* (2013.01);
(Continued)

(58) Field of Classification Search
CPC ............ H01L 23/5389; H01L 23/5384; H01L 21/486; H01L 21/76802
See application file for complete search history.

(56) References Cited

U.S. PATENT DOCUMENTS 8,072,046 B2 12/2011 Bae et al.
9,087,832 B2 7/2015 Huang et al.
(Continued)

FOREIGN PATENT DOCUMENTS

CN 1855461 A 11/2006
CN 101567345 A 10/2009
(Continued)

*Primary Examiner* — Antonio B Crite
(74) *Attorney, Agent, or Firm* — Slater Matsil, LLP

(57) ABSTRACT

In an embodiment, a device includes: a molding compound; an integrated circuit die encapsulated in the molding compound; a through via adjacent the integrated circuit die; and a redistribution structure over the integrated circuit die, the molding compound, and the through via, the redistribution structure electrically connected to the integrated circuit die and the through via, the redistribution structure including: a first dielectric layer disposed over the molding compound; a first conductive via extending through the first dielectric layer; a second dielectric layer disposed over the first dielectric layer and the first conductive via; and a second conductive via extending through the second dielectric layer and into a portion of the first conductive via, an interface between the first conductive via and the second conductive via being non-planar.

20 Claims, 26 Drawing Sheets

Related U.S. Application Data division of application No. 15/940,029, filed on Mar. 29, 2018, now Pat. No. 10,872,864.

(60) Provisional application No. 62/527,799, filed on Jun. 30, 2017.

(51) Int. Cl.

| | | |
|---|---|---|
| *H01L 21/56* | (2006.01) | |
| *H01L 21/683* | (2006.01) | |
| *H01L 21/768* | (2006.01) | |
| *H01L 23/00* | (2006.01) | |
| *H01L 23/31* | (2006.01) | |
| *H01L 23/50* | (2006.01) | |
| *H01L 23/538* | (2006.01) | |
| *H01L 25/00* | (2006.01) | |
| *H01L 25/065* | (2023.01) | |
| *H01L 25/10* | (2006.01) | |
| *H01L 25/16* | (2023.01) | |

(52) U.S. Cl.
CPC ............ *H01L 21/486* (2013.01); *H01L 21/56* (2013.01); *H01L 21/568* (2013.01); *H01L 21/6835* (2013.01); *H01L 21/76802* (2013.01); *H01L 21/76834* (2013.01); *H01L 21/76873* (2013.01); *H01L 21/76879* (2013.01); *H01L 23/3128* (2013.01); *H01L 23/5384* (2013.01); *H01L 23/5386* (2013.01); *H01L 24/19* (2013.01); *H01L 24/24* (2013.01); *H01L 25/105* (2013.01); *H01L 25/16* (2013.01); *H01L 25/50* (2013.01); *H01L 23/50* (2013.01); *H01L 25/0657* (2013.01); *H01L 2221/68331* (2013.01); *H01L 2221/68345* (2013.01); *H01L 2221/68359* (2013.01); *H01L 2221/68372* (2013.01); *H01L 2224/04105* (2013.01); *H01L 2224/12105* (2013.01); *H01L 2224/211* (2013.01); *H01L 2224/24265* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06568* (2013.01); *H01L 2225/06586* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01); *H01L 2924/19011* (2013.01); *H01L 2924/19102* (2013.01)

(56) References Cited

U.S. PATENT DOCUMENTS

| | | |
|---|---|---|
| 2003/0015342 A1 | 1/2003 | Sakamoto et al. |
| 2016/0021754 A1 | 1/2016 | Chen et al. |
| 2016/0071779 A1 | 3/2016 | Chen |
| 2017/0032977 A1 | 2/2017 | Chen et al. |
| 2017/0084555 A1 | 3/2017 | Yu et al. |
| 2017/0092581 A1* | 3/2017 | Chiu ................. H01L 21/76877 |
| 2019/0006283 A1 | 1/2019 | Wang et al. |

FOREIGN PATENT DOCUMENTS

| | | |
|---|---|---|
| CN | 203882998 U | 10/2014 |
| CN | 106409810 A | 2/2017 |
| KR | 20160010357 A | 1/2016 |

\* cited by examiner

SEMICONDUCTOR PACKAGE AND METHOD

PRIORITY CLAIM AND CROSS-REFERENCE

This application is a continuation of U.S. patent application Ser. No. 17/129,067, filed on Dec. 21, 2020, entitled "Semiconductor Package and Method," which is a divisional of U.S. patent application Ser. No. 15/940,029, filed on Mar. 29, 2018, entitled "Semiconductor Package and Method," now U.S. Pat. No. 10,872,864, issued on Dec. 22, 2020, which claims the benefit of U.S. Provisional Application No. 62/527,799, filed on Jun. 30, 2017, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
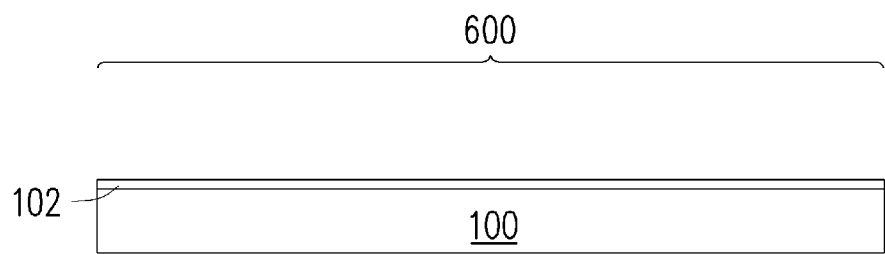
FIGS. 1 through 23 illustrate cross-sectional views of intermediate steps during a process for forming a package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) having stacked via structures in a redistribution structure, and methods of forming the same. Stacked via structures are used herein to describe a plurality ("stack") of conductive vias interconnecting different metallization patterns, where each of the plurality of conductive vias are vertically aligned (e.g., a line perpendicular to a major surface of the redistribution structure extends through each of the plurality of conductive vias). Various embodiments may provide methods of forming the stacked conductive vias with reduced defects, such as, reduced stress at via-to-via interfaces during thermal cycle testing, reduced void formation inside the vias and/or at metal oxide (e.g., copper oxide) interlayers between adjacently stacked vias, and the like. For example, various embodiments may provide a seed layer as a diffusion blocking layer (e.g., copper diffusion) between adjacently stacked vias. In some embodiments, the seed layer may be a multi-layered structure comprising, for example, a layer of titanium and a layer of copper. Furthermore, interfaces between stacked vias may be non-planar (e.g., staggered) to enhance the overall strength of the stacked via structure. Various embodiments may provide these embodiments without significantly increasing manufacturing costs.

The teachings of this disclosure are applicable to any package structure including stacked conductive vias. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 23 illustrate cross-sectional views of intermediate steps during a process for forming a first package 200, in accordance with some embodiments. The first package 200 may also be referred to as an integrated fan-out (InFO) package. FIGS. 1 through 23 are cross-sectional views that illustrate a first package region 600 for the formation of the first package 200. It should be appreciated that a plurality of packages may be simultaneously formed in a plurality of package regions.

In FIG. 1, a carrier substrate 100 is provided, and a release layer 102 is formed on the carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
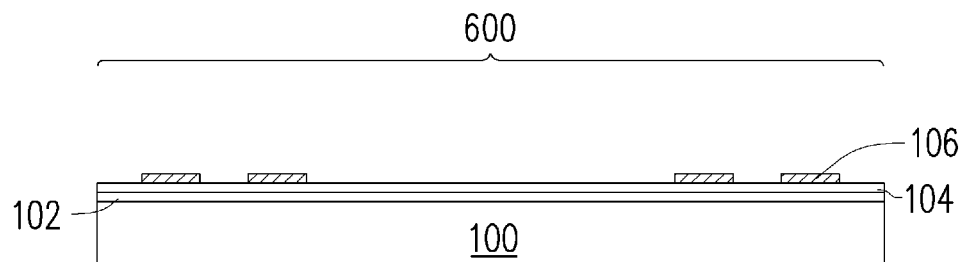

In FIG. 2, a dielectric layer 104 and a metallization pattern 106 (sometimes referred to as redistribution layer or redistribution line) is formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
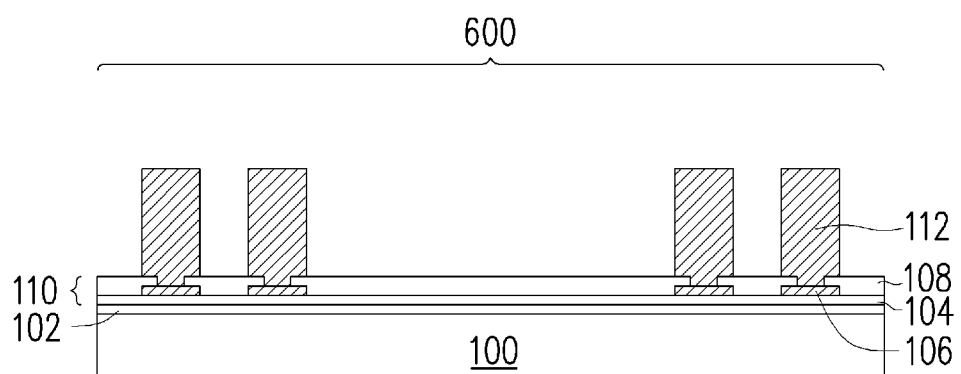

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. In the embodiment shown, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias (not shown) may be formed during the formation of a metallization pattern by forming the seed layer and conductive material of the metallization pattern in the opening of the underlying dielectric layer. The vias may therefore interconnect and electrically couple the various metallization patterns.

Through vias 112 are then formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 112.

Figure 4:
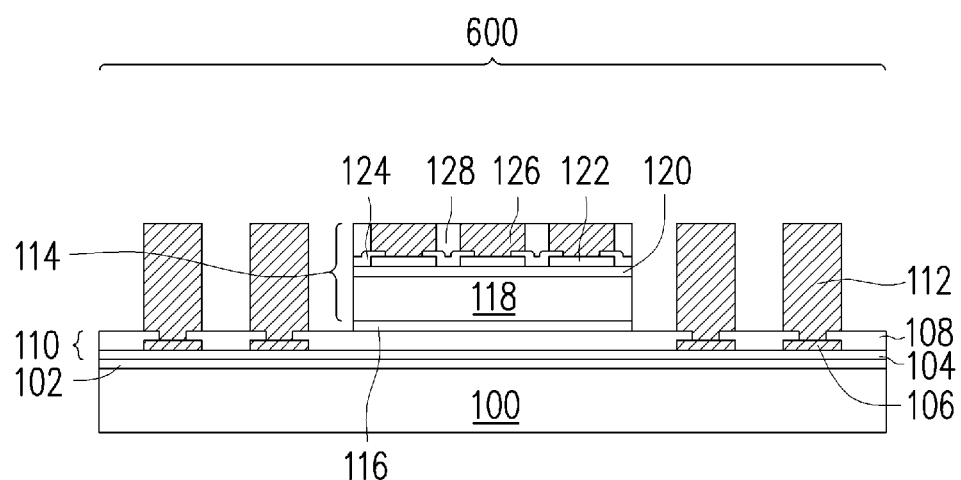

In FIG. 4, an integrated circuit die 114 is adhered to the dielectric layer 108 by an adhesive 116. In the embodiment shown, one integrated circuit die 114 is adhered in the first package region 600; in other embodiments, more or less integrated circuit dies 114 may be adhered in each region. For example, in an embodiment, a plurality of integrated circuit dies 114 may be adhered in the first package region 600. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are formed through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrated circuit dies 114. Solder caps (not shown) may be formed on the die connectors 126 during die testing.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
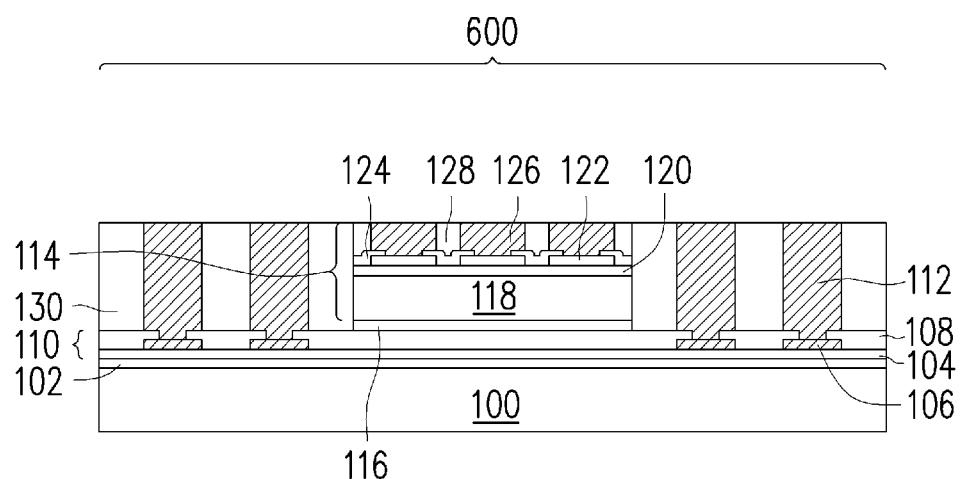

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6A through 21B, a front-side redistribution structure 131 is formed. As will be illustrated, the front-side redistribution structure 131 includes dielectric layers 133, 146, 160, and 174 and metallization patterns 142, 156, and 170 (sometimes referred to as redistribution layers or redistribution lines). In FIGS. 6A through 21B, figures ending with an "A" designation are cross-sectional views illustrating the first package region 600, and figures ending with a "B" designation are cross-sectional views illustrating more details of a region 650 of the front-side redistribution structure 131 over the integrated circuit dies 114. In the region 650 of the front-side redistribution structure 131, a stacked via structure 132 is formed. The stacked via structure 132 has conductive vias that are vertically aligned (e.g., a line perpendicular to a major surface of the encapsulant 130 extends through each of the plurality of conductive vias). In FIGS. 6A through 21B, some features (such as seed layers, discussed below) may only be shown in one of the "A" or "B" figures, and may be omitted from the respective "B" or "A" figure for simplicity.

Figure 6A:
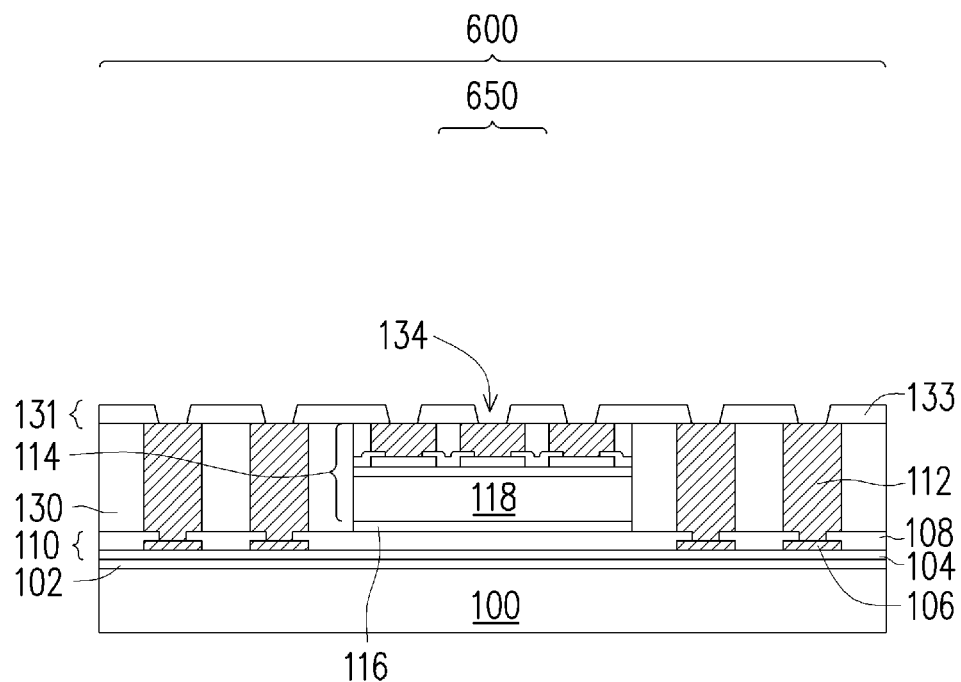
Figure 6B:
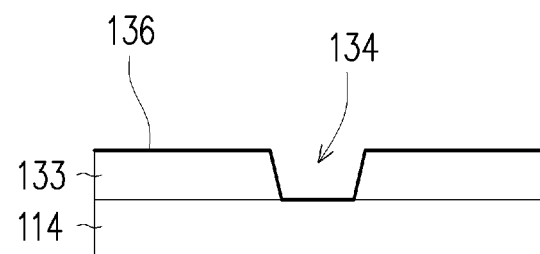

In FIGS. 6A and 6B, the dielectric layer 133 is deposited on the encapsulant 130, through vias 112, and die connectors 126. In some embodiments, the dielectric layer 133 is formed of a polymer, which may be a photo-sensitive material such as PBO, polyimide, BCB, or the like, that may be patterned using a lithography mask. In other embodiments, the dielectric layer 133 is formed of a nitride such as silicon nitride; an oxide such as silicon oxide, PSG, BSG, BPSG; or the like. The dielectric layer 133 may be formed by spin coating, lamination, CVD, the like, or a combination thereof.

The dielectric layer 133 is then patterned. The patterning forms openings 134 to expose portions of the through vias 112 and the die connectors 126. The patterning may be by an acceptable process, such as by exposing the dielectric layer 133 to light when the dielectric layer 133 is a photo-sensitive material or by etching using, for example, an anisotropic etch. If the dielectric layer 133 is a photo-sensitive material, the dielectric layer 133 can be developed after the exposure.

A seed layer 136 is then formed over the dielectric layer 133 and in the openings 134 extending through the dielectric layer 133. In some embodiments, the seed layer 136 is a metal layer, which may be a single layer or a composite layer comprising a plurality of sub-layers formed of different materials. In some embodiments, the seed layer 136 comprises a titanium layer and a copper layer over the titanium layer. The seed layer 136 may be formed using, for example, PVD or the like.

Figure 7A:
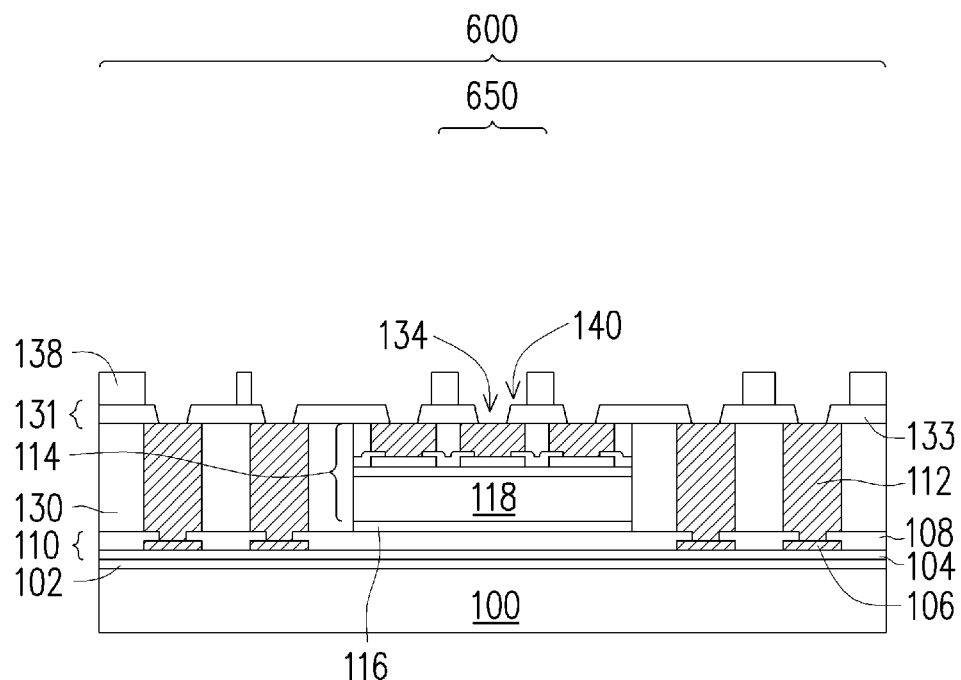
Figure 7B:
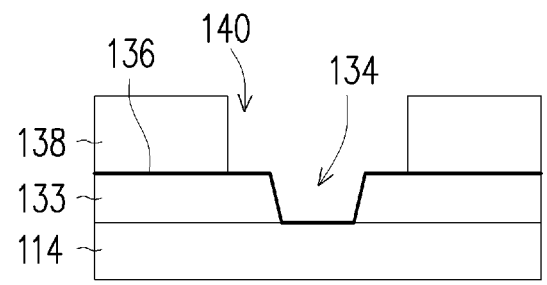

In FIGS. 7A and 7B, a photo resist 138 is formed and patterned on the seed layer 136. The photo resist 138 may be formed by spin coating or the like and may be exposed to light for patterning. The pattern of the photo resist 138 corresponds to the metallization pattern 142. The patterning forms openings 140 through the photo resist 138 to expose the seed layer 136.

Figure 8A:
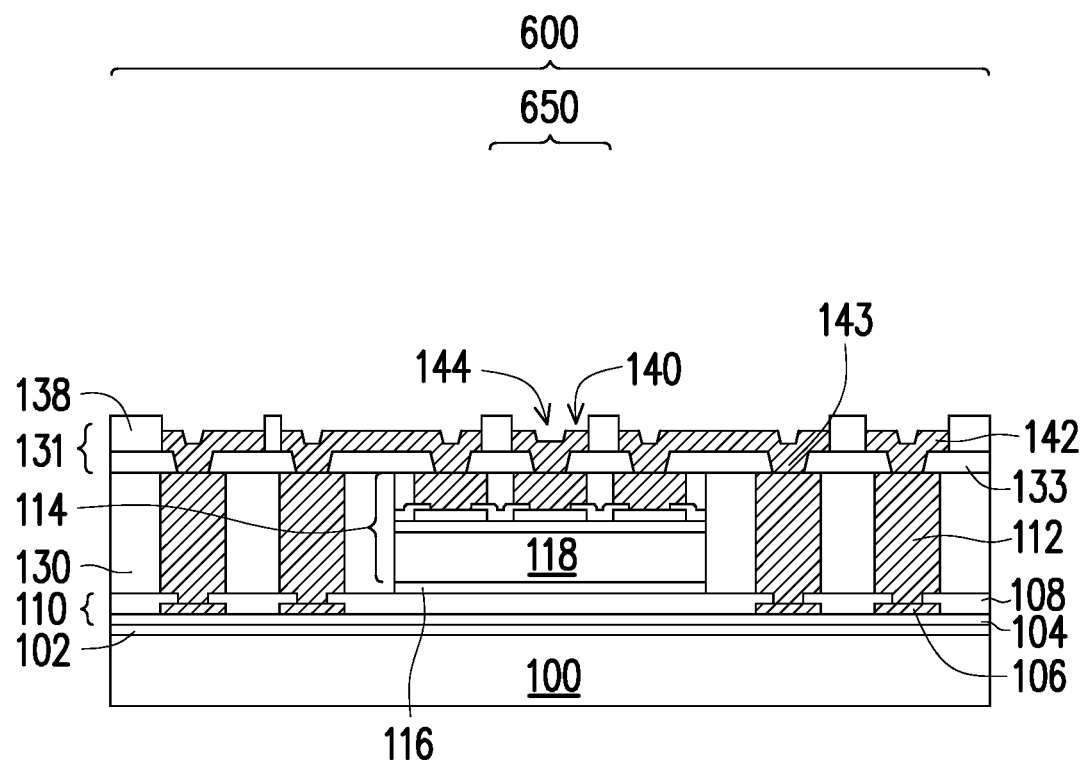
Figure 8B:
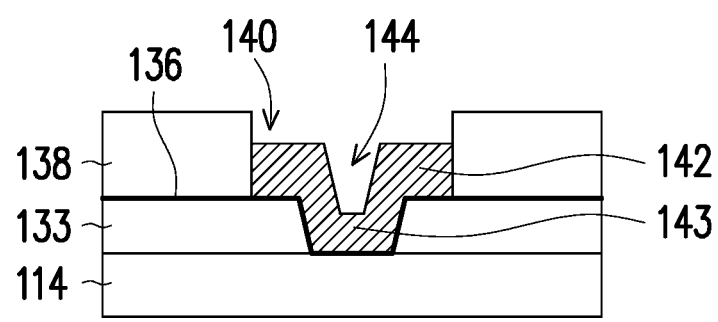

In FIGS. 8A and 8B, a conductive material is formed in the openings 140 of the photo resist 138 and on the exposed portions of the seed layer 136. The conductive material may be formed by plating, such as electroplating or electroless plating, or the like. The conductive material may comprise a metal, like copper, titanium, tungsten, aluminum, or the like. In an embodiment, the conductive material is formed by a conformal plating process. The conformal plating process may be a copper electroplating process performed with a current density of less than about 2.2 A/dm$^2$, such as a current density from about 0.3 A/dm$^2$ to about 0.9 A/dm$^2$. The plating solution may comprise, e.g., copper sulfate, and may have additives such as an accelerator agent, a suppressor agent, a leveler agent, and/or the like. Such a plating solution and current density allows the plating process to be a conformal plating process. Because the metallization pattern 142 is formed with a conformal plating process, portions of the metallization pattern 142 extending along the top surface of the dielectric layer 133 may have about the same thickness as portions of the metallization pattern 142 extending along the sides and bottom of the openings 134.

The combination of the conductive material and underlying portions of the seed layer 136 form the metallization pattern 142. A portion of the metallization pattern 142 forms a first layer of the stacked via structure 132. The metallization pattern 142 includes conductive vias 143. The conductive vias 143 are formed in the openings 134 through the dielectric layer 133 to, e.g., the through vias 112 and/or the die connectors 126. Further, as a result of the conformal plating process, recesses 144 are formed in the conductive vias 143.

Figure 9A:
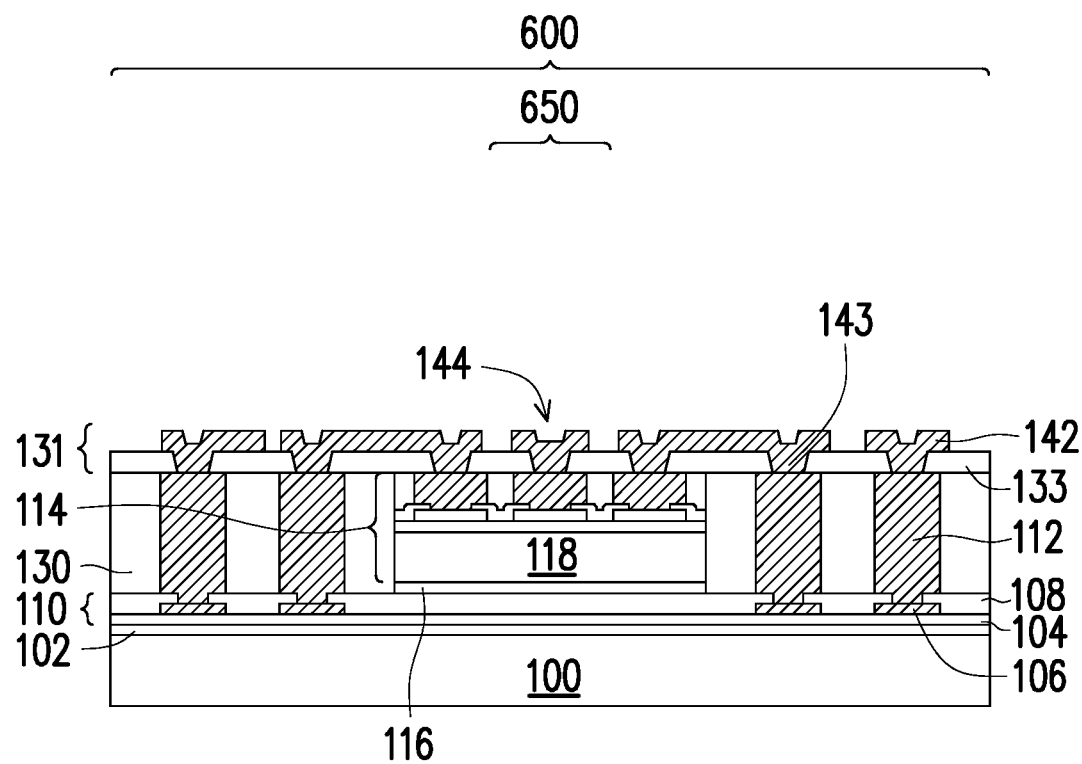
Figure 9B:
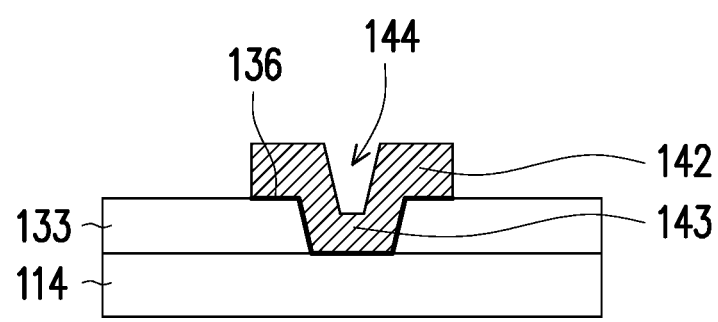

In FIGS. 9A and 9B, the photo resist 138 and portions of the seed layer 136 on which the conductive material is not formed are removed. The photo resist 138 may be removed by an acceptable ashing or stripping process, such as using an oxygen plasma or the like. Once the photo resist 138 is removed, exposed portions of the seed layer 136 are removed, such as by using an acceptable etching process, such as by wet or dry etching.

Figure 10A:
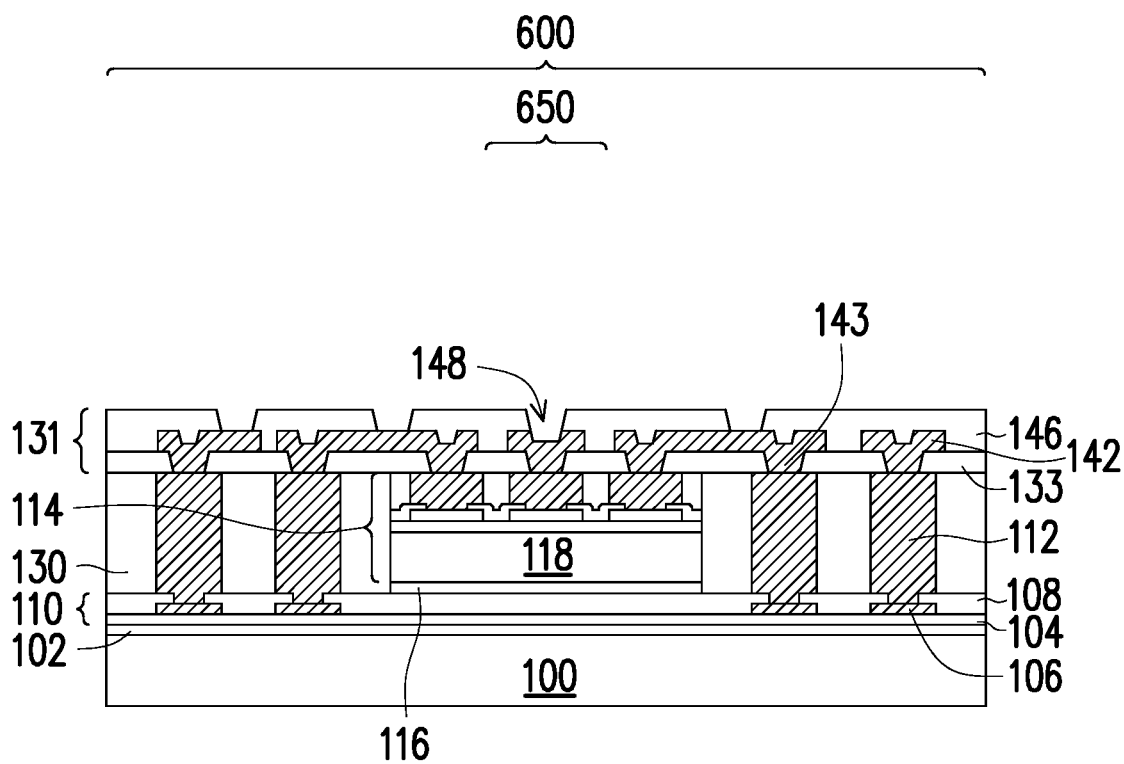
Figure 10B:
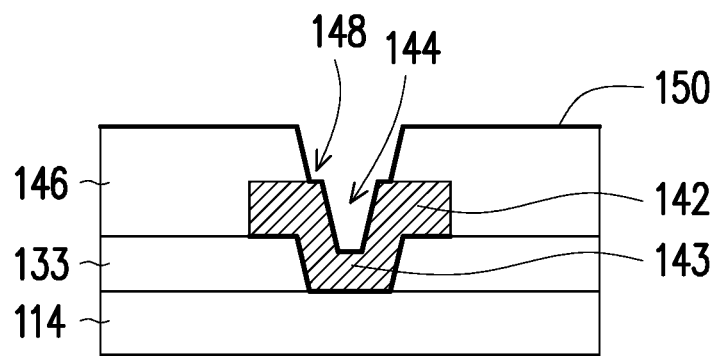

In FIGS. 10A and 10B, the dielectric layer 146 is deposited on the dielectric layer 133 and the metallization pattern 142. In some embodiments, the dielectric layer 146 is formed of a polymer, which may be a photo-sensitive material such as PBO, polyimide, BCB, or the like, that may be patterned using a lithography mask. In other embodiments, the dielectric layer 146 is formed of a nitride such as silicon nitride; an oxide such as silicon oxide, PSG, BSG, BPSG; or the like. The dielectric layer 146 may be formed by spin coating, lamination, CVD, the like, or a combination thereof.

The dielectric layer 146 is then patterned. The patterning forms openings 148 to expose portions of the metallization pattern 142. In particular, the openings 148 expose the recesses 144. The patterning may be by an acceptable process, such as by exposing the dielectric layer 146 to light when the dielectric layer is a photo-sensitive material or by etching using, for example, an anisotropic etch. If the dielectric layer 146 is a photo-sensitive material, the dielectric layer 146 can be developed after the exposure.

A seed layer 150 is then formed over the dielectric layer 146 and in the openings 148. In some embodiments, the seed layer 150 is a metal layer, which may be a single layer or a composite layer comprising a plurality of sub-layers formed of different materials. In some embodiments, the seed layer 150 comprises a titanium layer and a copper layer over the titanium layer. The seed layer 150 may be formed using, for example, PVD or the like. The seed layer 150 extends along a top surface of the dielectric layer 146, along sides of the openings 148, along a topmost surface of the metallization patterns 142 exposed by the openings 148, along portions of the conductive vias 143 defining the sides of the recesses 144, and along portions of the conductive vias 143 defining the bottom of the recesses 144.

Figure 11A:
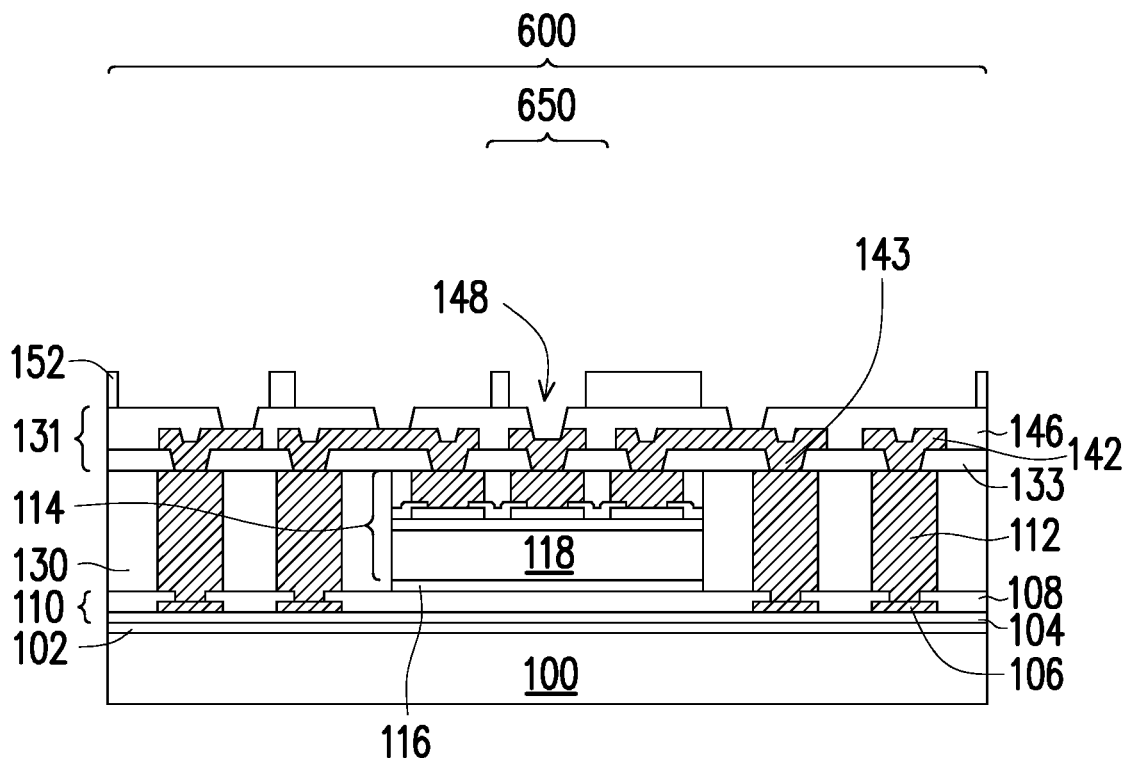
Figure 11B:
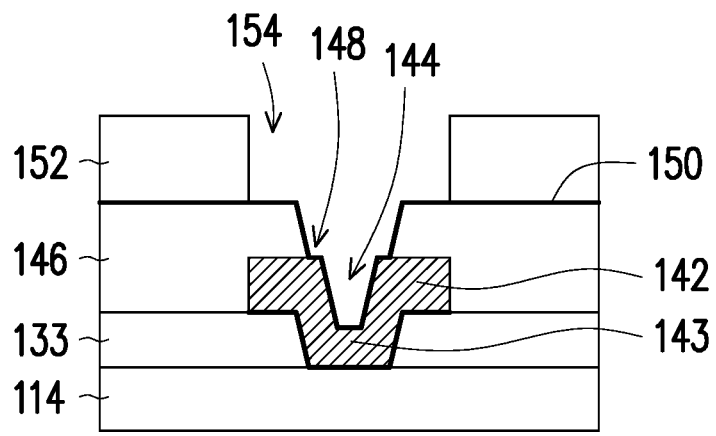

In FIGS. 11A and 11B, a photo resist 152 is formed and patterned on the seed layer 150. The photo resist 152 may be formed by spin coating or the like and may be exposed to light for patterning. The pattern of the photo resist 152 corresponds to the metallization pattern 156. The patterning forms openings 154 through the photo resist to expose the seed layer 150. The openings 154 expose the openings 148 of the dielectric layer 146.

Figure 12A:
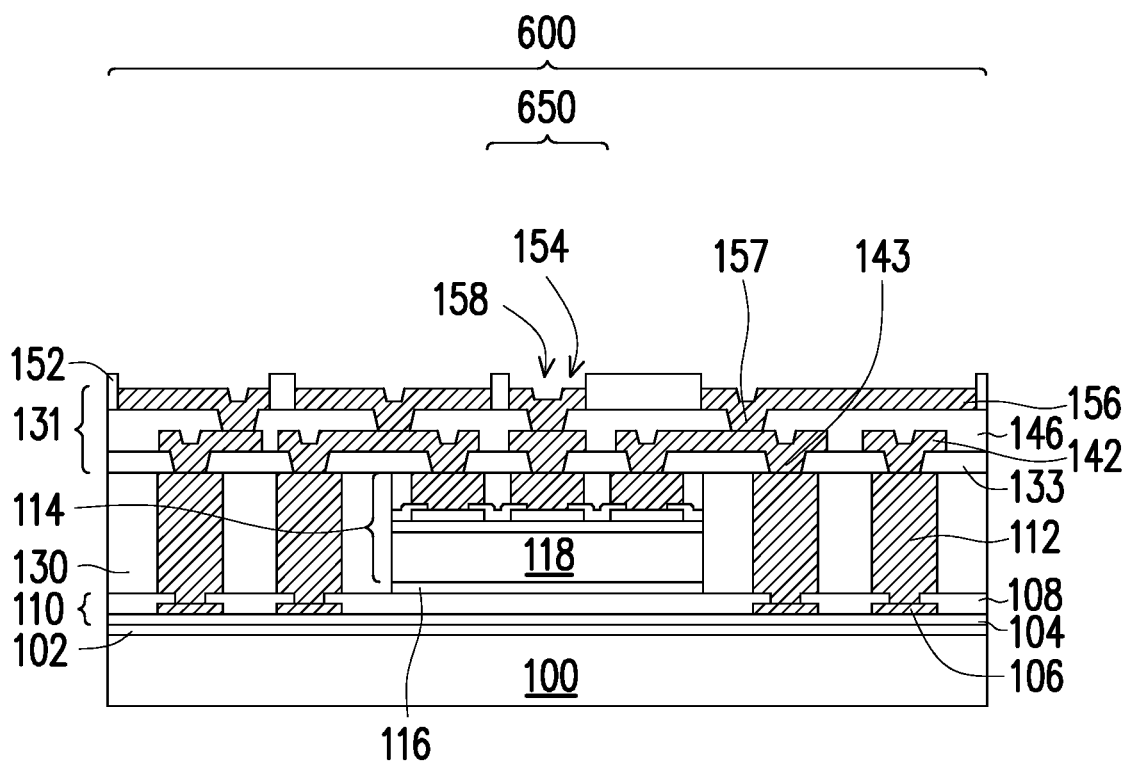
Figure 12B:
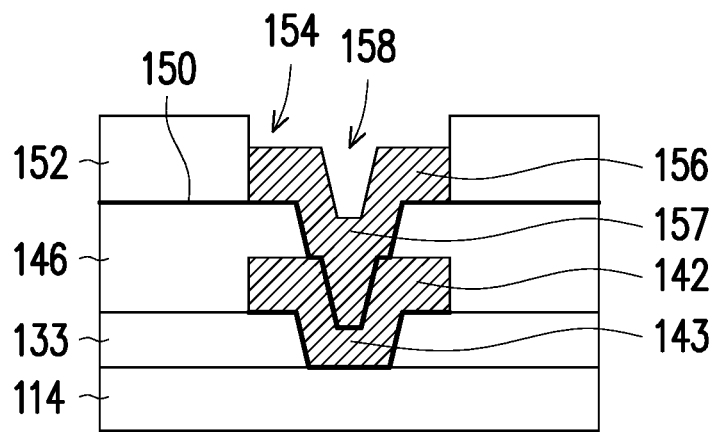

In FIGS. 12A and 12B, a conductive material is formed on the exposed portions of the seed layer 150 in the openings 154 of the photo resist 152. The conductive material may be formed by plating, such as electroplating or electroless plating, or the like. The conductive material may comprise a metal, like copper, titanium, tungsten, aluminum, or the like. In an embodiment, the conductive material is formed by a conformal plating process (similar to the metallization pattern 142).

The combination of the conductive material and underlying portions of the seed layer 150 form the metallization pattern 156. A portion of the metallization pattern 156 forms a second layer of the stacked via structure 132. The metallization pattern 156 includes conductive vias 157. The conductive vias 157 are formed in the openings 148 through the dielectric layer 146 to the metallization pattern 142. In particular, the conductive vias 157 extend into the recesses 144 of the conductive vias 143. Further, as a result of the conformal plating process, recesses 158 are formed in the conductive vias 157.

Figure 13A:
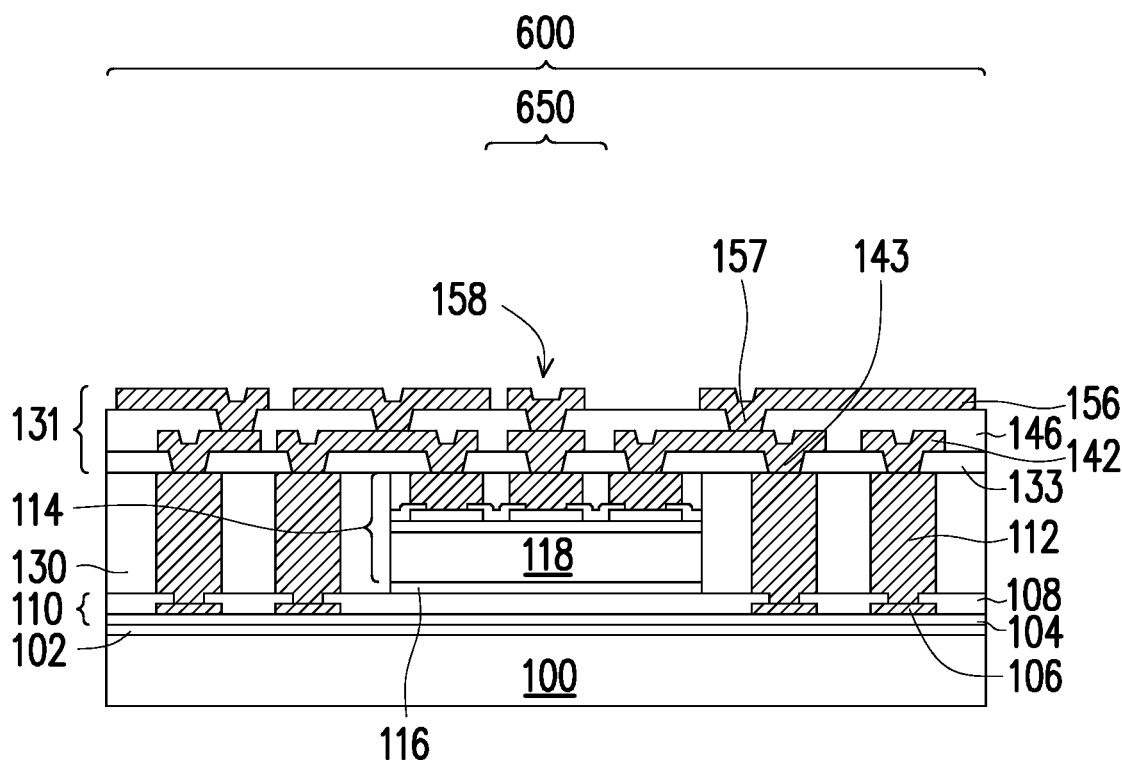
Figure 13B:
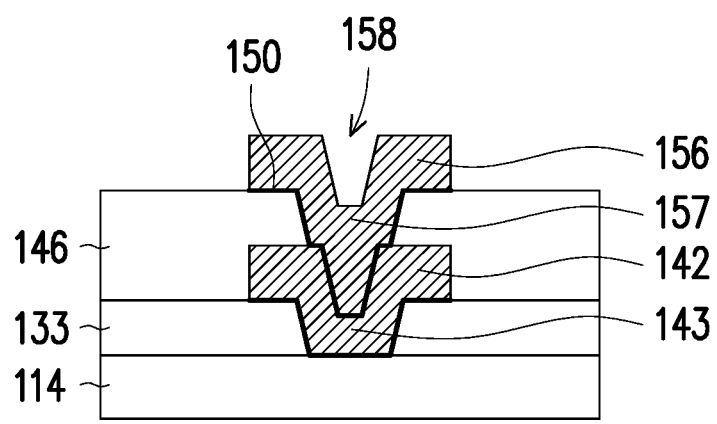

In FIGS. 13A and 13B, the photo resist 152 and portions of the seed layer 150 on which the conductive material is not formed are removed. The photo resist 152 may be removed by an acceptable ashing or stripping process, such as using an oxygen plasma or the like. Once the photo resist 152 is removed, exposed portions of the seed layer 150 are removed, such as by using an acceptable etching process, such as by wet or dry etching.

By forming the conductive vias 143 having recesses 144, the interface of the metallization patterns 142 and 156 may be non-planar (e.g., staggered). Further, the interface of the metallization patterns 142 and 156 may occupy multiple planes that are offset from (e.g., in a different plane than) the interface of the dielectric layers 133 and 146. Package stress may concentrate at the interface of the dielectric layers 133 and 146. By offsetting the interface of the dielectric layers 133 and 146 from the multiple interfacial planes of the metallization patterns 142 and 156, further package stress concentration may be avoided, thereby reducing the chances of cracks forming at the interface of the metallization patterns 142 and 156.

Figure 14A:
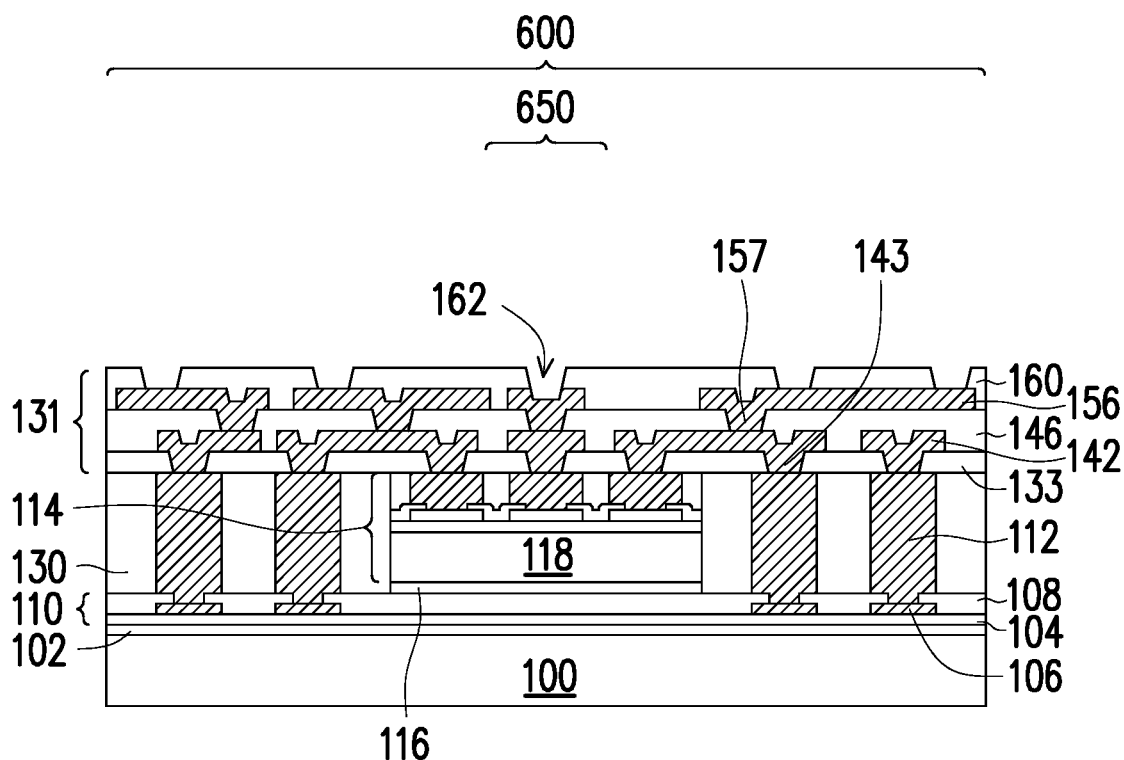
Figure 14B:
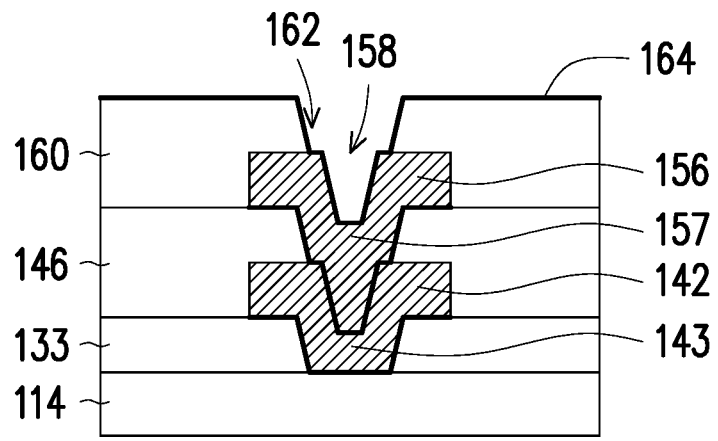

In FIGS. 14A and 14B, the dielectric layer 160 is deposited on the dielectric layer 146 and the metallization pattern 156. In some embodiments, the dielectric layer 160 is formed of a polymer, which may be a photo-sensitive material such as PBO, polyimide, BCB, or the like, that may be patterned using a lithography mask. In other embodiments, the dielectric layer 160 is formed of a nitride such as silicon nitride; an oxide such as silicon oxide, PSG, BSG, BPSG; or the like. The dielectric layer 160 may be formed by spin coating, lamination, CVD, the like, or a combination thereof.

The dielectric layer 160 is then patterned. The patterning forms openings 162 to expose portions of the metallization pattern 156. In particular, the openings 162 expose the recesses 158. The patterning may be by an acceptable process, such as by exposing the dielectric layer 160 to light when the dielectric layer is a photo-sensitive material or by etching using, for example, an anisotropic etch. If the dielectric layer 160 is a photo-sensitive material, the dielectric layer 160 can be developed after the exposure.

A seed layer 164 is then formed over the dielectric layer 160 and in the openings 162. In some embodiments, the seed layer 164 is a metal layer, which may be a single layer or a composite layer comprising a plurality of sub-layers formed of different materials. In some embodiments, the seed layer 164 comprises a titanium layer and a copper layer over the titanium layer. The seed layer 164 may be formed using, for example, PVD or the like. The seed layer 164 extends along a top surface of the dielectric layer 160, along sides of the openings 162, along a topmost surface of the metallization patterns 156 exposed by the openings 162, along portions of the conductive vias 157 defining the sides of the recesses 158, and along portions of the conductive vias 157 defining the bottom of the recesses 158.

Figure 15A:
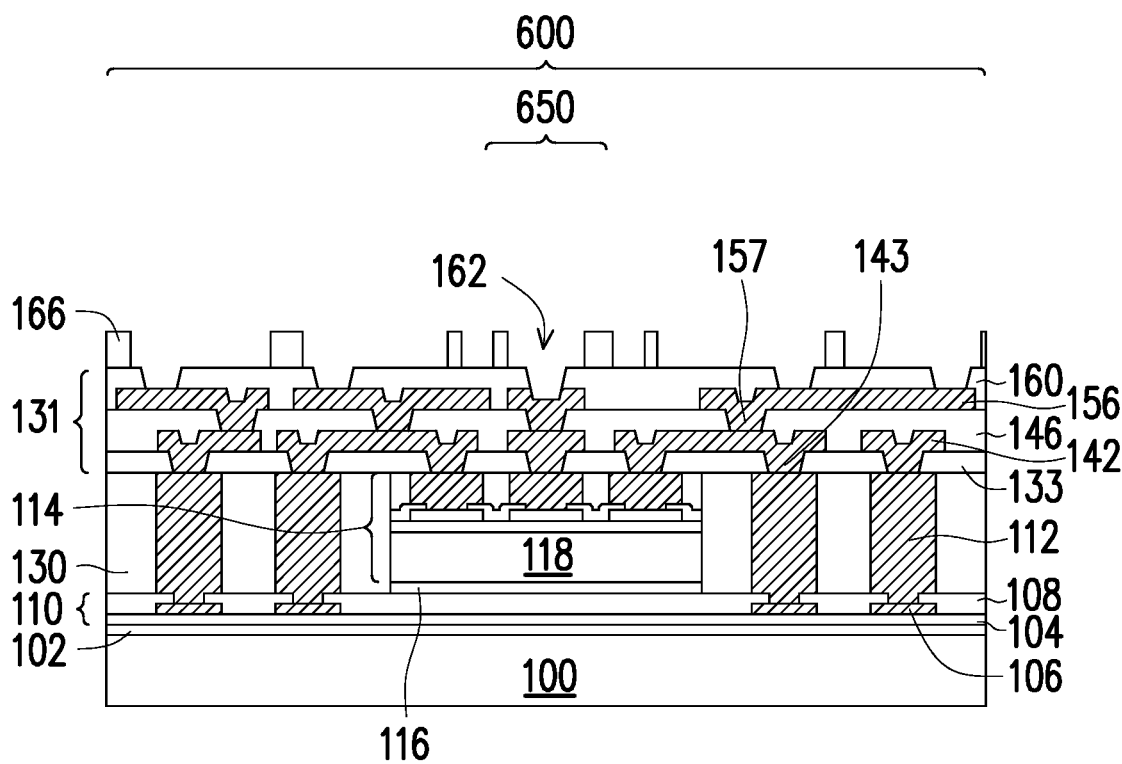
Figure 15B:
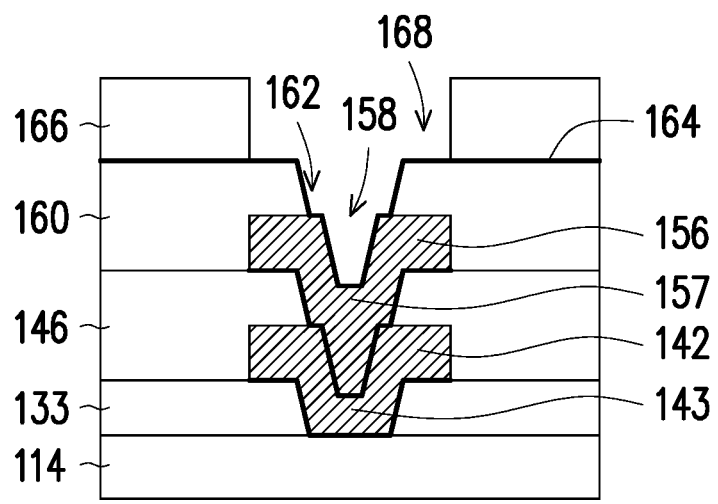

In FIGS. 15A and 15B, a photo resist 166 is formed and patterned on the seed layer 164. The photo resist 166 may be formed by spin coating or the like and may be exposed to light for patterning. The pattern of the photo resist 166 corresponds to the metallization pattern 170. The patterning forms openings 168 through the photo resist to expose the seed layer 164. The openings 168 expose the openings 162 of the dielectric layer 160.

Figure 16A:
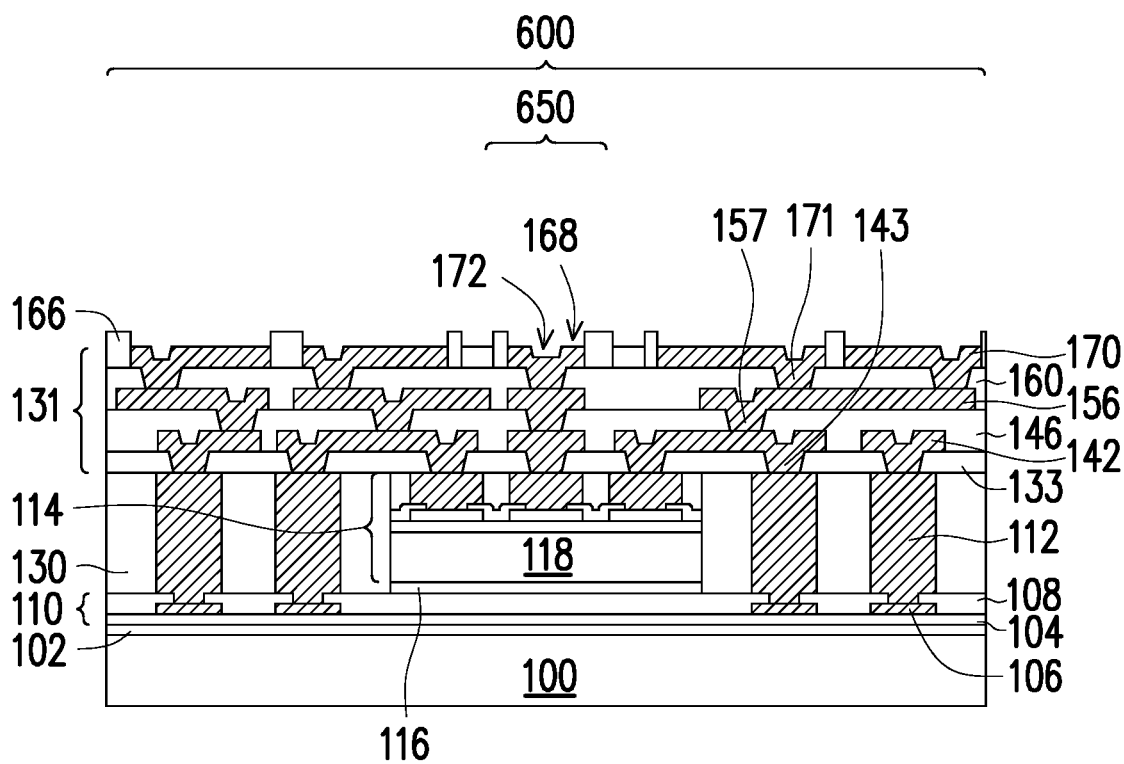
Figure 16B:
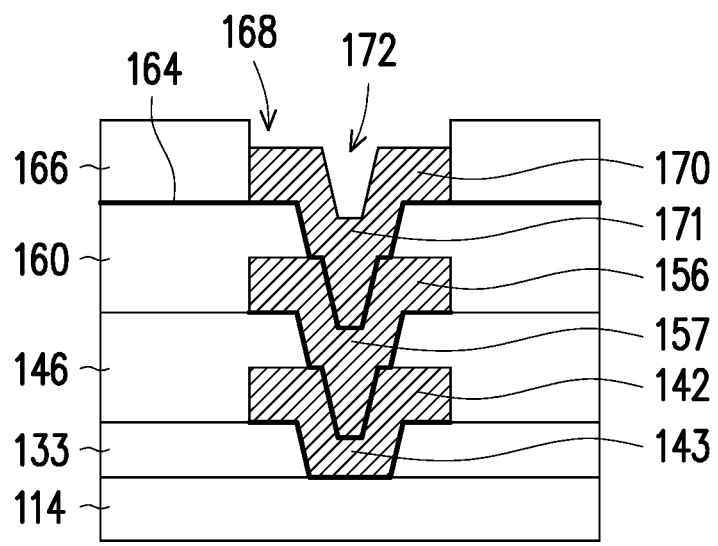

In FIGS. 16A and 16B, a conductive material is formed on the exposed portions of the seed layer 164 in the openings 168 of the photo resist 166. The conductive material may be formed by plating, such as electroplating or electroless plating, or the like. The conductive material may comprise a metal, like copper, titanium, tungsten, aluminum, or the like. In an embodiment, the conductive material is formed by a conformal plating process (similar to the metallization pattern 156).

The combination of the conductive material and underlying portions of the seed layer 164 form the metallization pattern 170. A portion of the metallization pattern 170 forms a third layer of the stacked via structure 132. The metallization pattern 170 includes conductive vias 171. The conductive vias 171 are formed in the openings 162 through the dielectric layer 160 to the metallization pattern 156. In particular, the conductive vias 171 extend into the recesses 158 of the conductive vias 157. Further, as a result of the conformal plating process, recesses 172 are formed in the conductive vias 171.

Figure 17A:
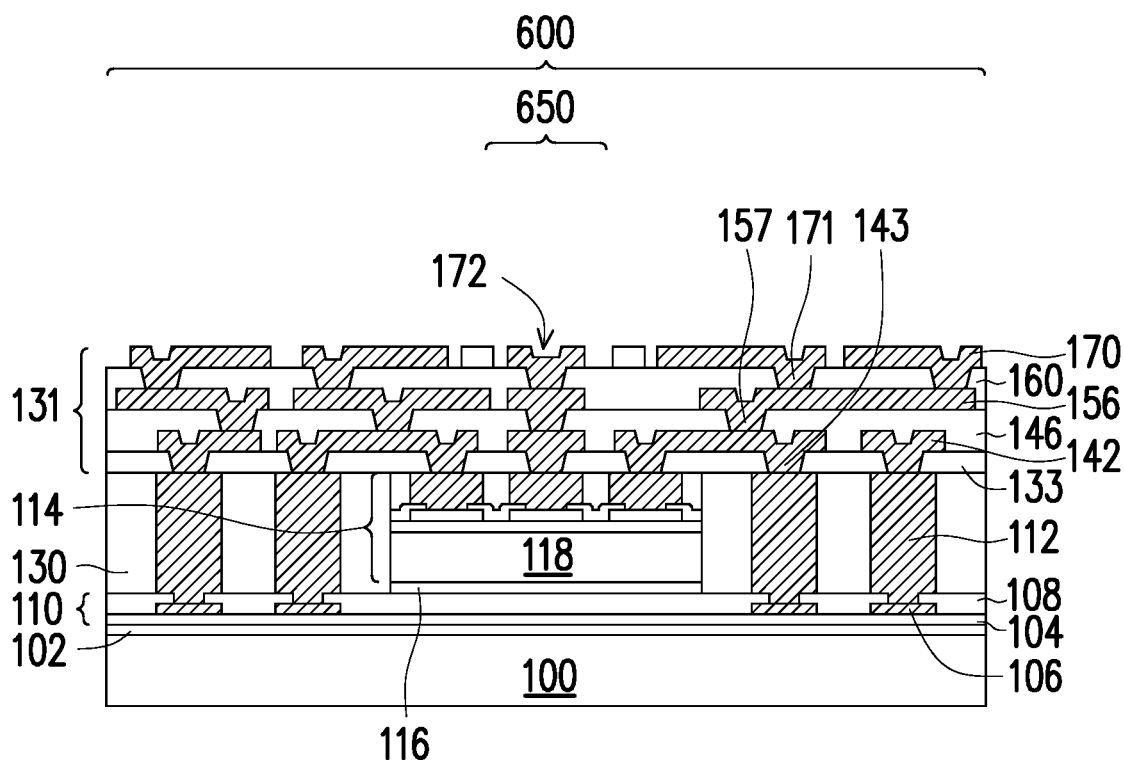
Figure 17B:
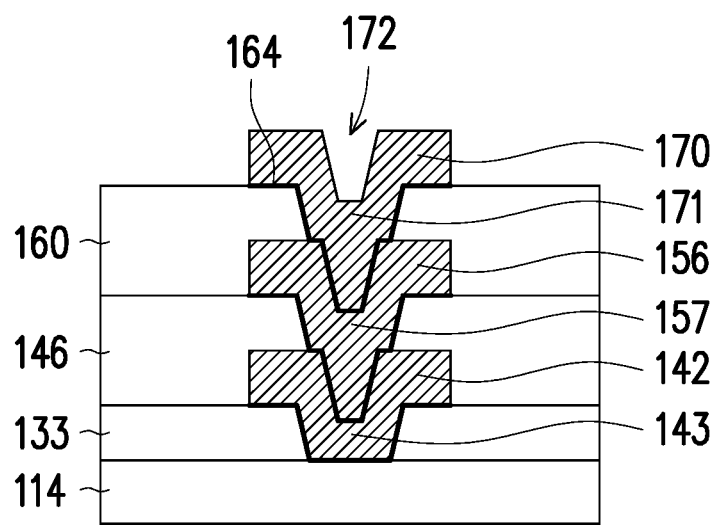

In FIGS. 17A and 17B, the photo resist 166 and portions of the seed layer 164 on which the conductive material is not formed are removed. The photo resist 166 may be removed by an acceptable ashing or stripping process, such as using an oxygen plasma or the like. Once the photo resist 166 is removed, exposed portions of the seed layer 164 are removed, such as by using an acceptable etching process, such as by wet or dry etching.

Figure 18A:
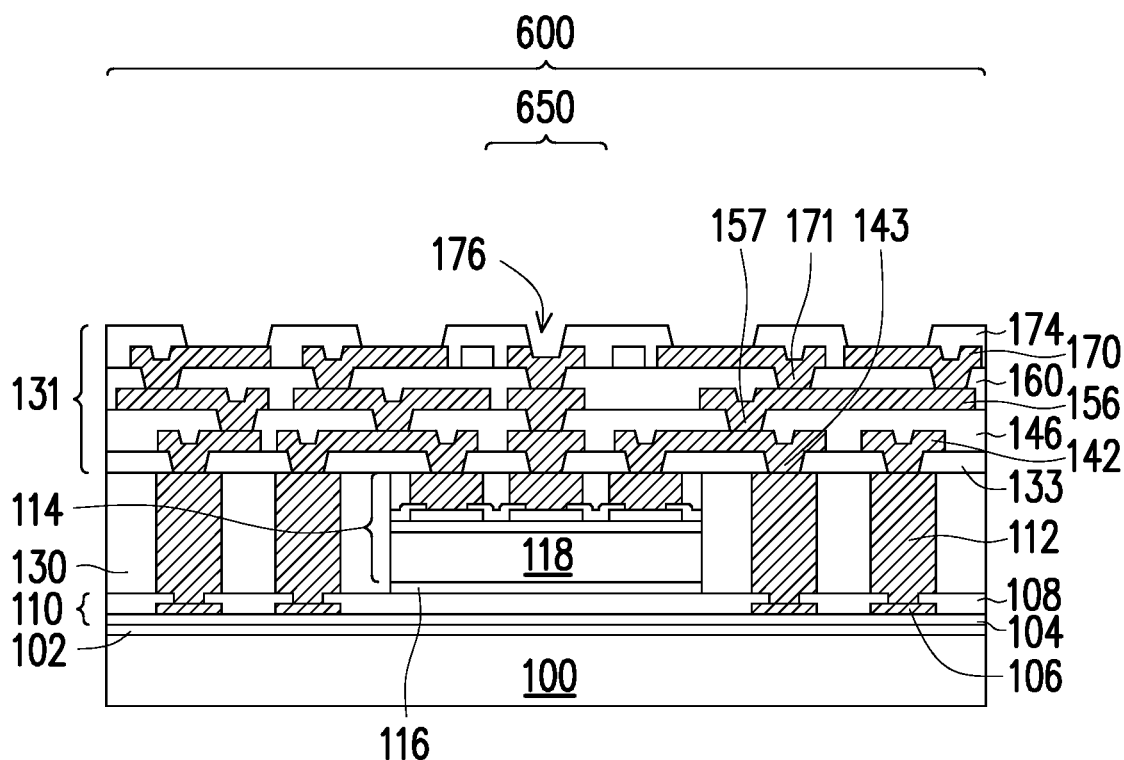
Figure 18B:
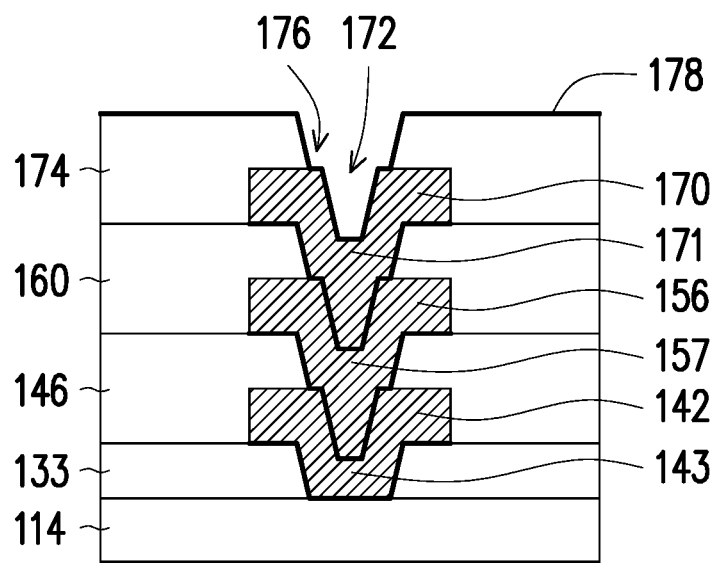

In FIGS. 18A and 18B, the dielectric layer 174 is deposited on the dielectric layer 160 and the metallization pattern 170. In some embodiments, the dielectric layer 174 is formed of a polymer, which may be a photo-sensitive material such as PBO, polyimide, BCB, or the like, that may be patterned using a lithography mask. In other embodiments, the dielectric layer 174 is formed of a nitride such as silicon nitride; an oxide such as silicon oxide, PSG, BSG, BPSG; or the like. The dielectric layer 174 may be formed by spin coating, lamination, CVD, the like, or a combination thereof.

The dielectric layer 174 is then patterned. The patterning forms openings 176 to expose portions of the metallization pattern 170. In particular, the openings 176 expose the recesses 172. The patterning may be by an acceptable process, such as by exposing the dielectric layer 174 to light when the dielectric layer is a photo-sensitive material or by etching using, for example, an anisotropic etch. If the dielectric layer 174 is a photo-sensitive material, the dielectric layer 174 can be developed after the exposure.

A seed layer 178 is then formed over the dielectric layer 174 and in the openings 176. In some embodiments, the seed layer 178 is a metal layer, which may be a single layer or a composite layer comprising a plurality of sub-layers formed of different materials. In some embodiments, the seed layer 178 comprises a titanium layer and a copper layer over the titanium layer. The seed layer 178 may be formed using, for example, PVD or the like. The seed layer 178 extends along a top surface of the dielectric layer 174, along sides of the openings 176, along a topmost surface of the metallization patterns 170 exposed by the openings 176, along portions of the conductive vias 171 defining the sides of the recesses 172, and along portions of the conductive vias 171 defining the bottom of the recesses 172.

Figure 19A:
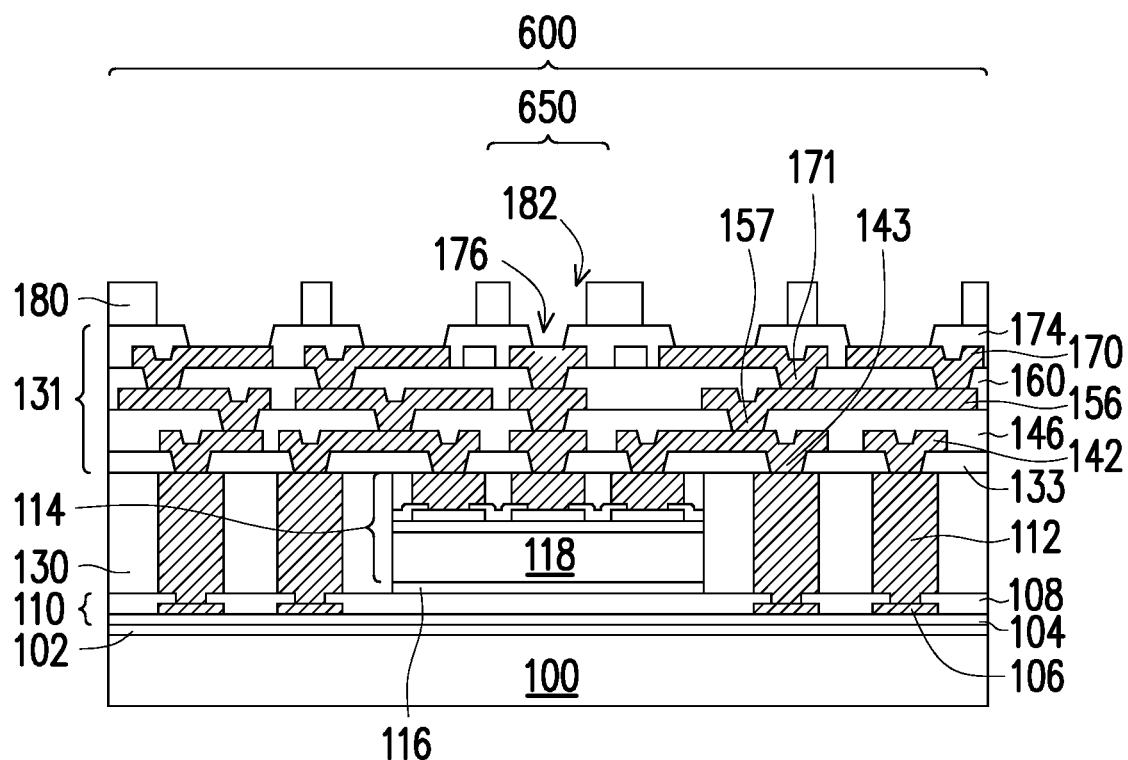
Figure 19B:
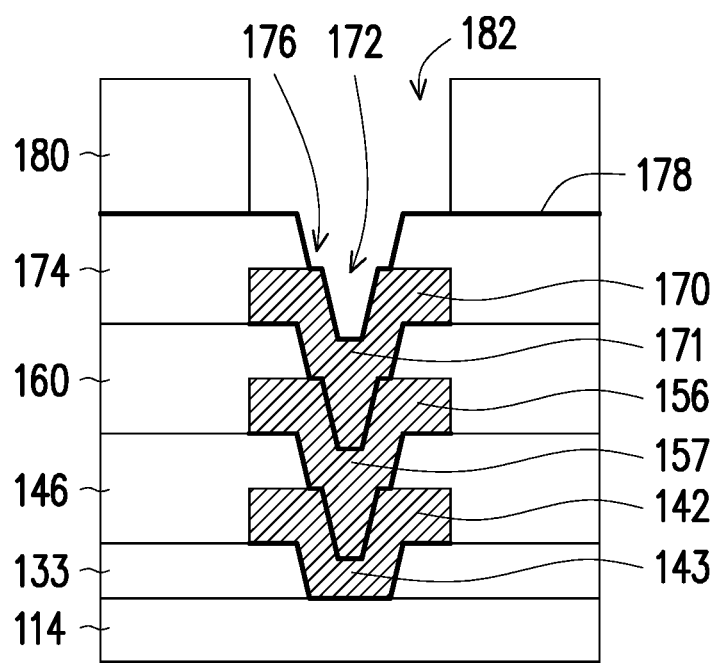

In FIGS. 19A and 19B, a photo resist 180 is formed and patterned on the seed layer 178. The photo resist 180 may be formed by spin coating or the like and may be exposed to light for patterning. The pattern of the photo resist 180 corresponds to the pads 184. The patterning forms openings 182 through the photo resist to expose the seed layer 178. The openings 182 expose the openings 176 of the dielectric layer 174. The pattern of the openings 182 in the photo resist 180 corresponds to pads that will be subsequently formed on an exterior side of the front-side redistribution structure 131.

Figure 20A:
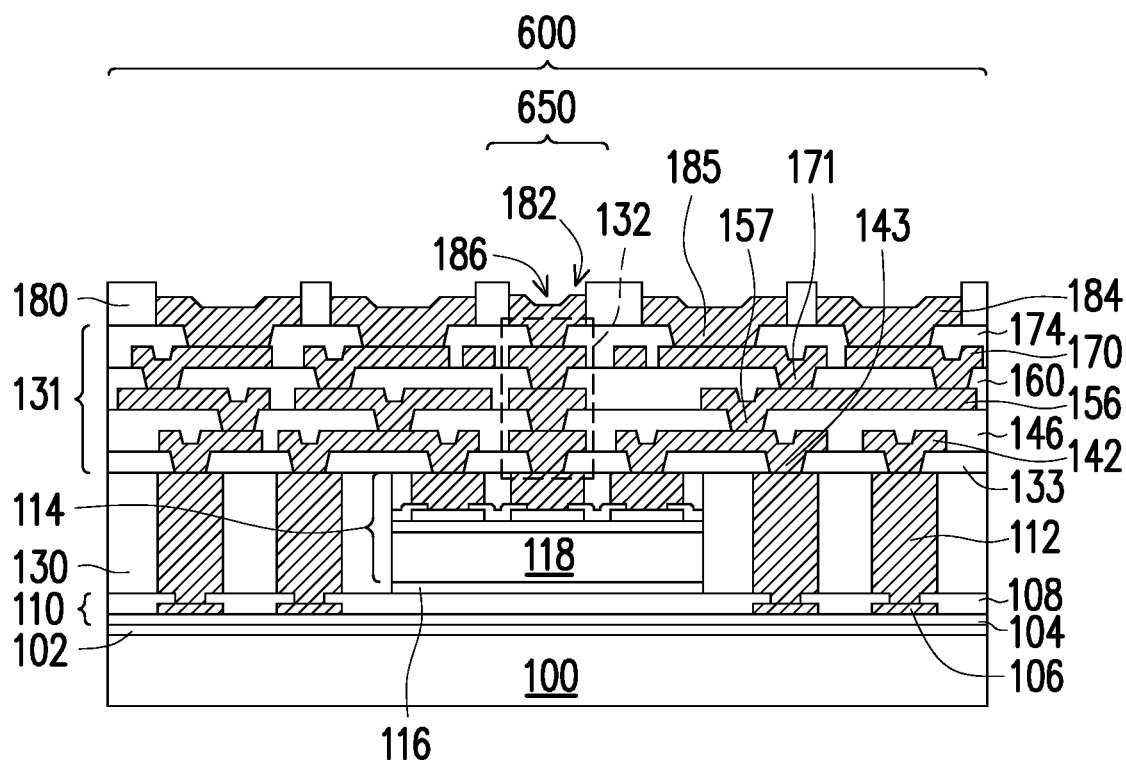
Figure 20B:
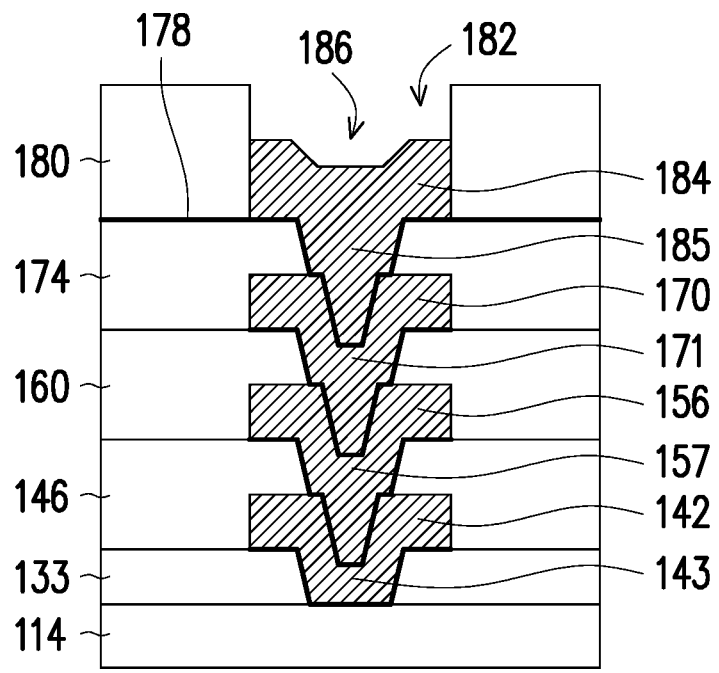

In FIGS. 20A and 20B, a conductive material is formed on the exposed portions of the seed layer 178 in the openings 182 of the photo resist 180. The conductive material may be formed by plating, such as electroplating or electroless plating, or the like. The conductive material may comprise a metal, like copper, titanium, tungsten, aluminum, or the like. In an embodiment, the conductive material is formed by a gap-filling plating process, which has different plating process parameters than the conformal plating process. The gap-filling plating process may be a copper electroplating process performed with a current density of from about 2.0 A/dm$^2$ to about 6.0 A/dm$^2$, such as greater than about 2.2 A/dm$^2$. The plating solution may comprise copper sulfate, and may have additives such as an accelerator agent, a suppressor agent, a leveler agent, and/or the like. Such a plating solution and current density allows the plating process to be a gap-filling plating process. The plating solution for the gap-filling plating process may be similar to or different from the plating solution for the conformal plating process.

The combination of the conductive material and underlying portions of the seed layer 178 form the pads 184. A portion of the pads 184 forms a fourth layer of the stacked via structure 132. The pads 184 include conductive vias 185. The conductive vias 185 are formed in the openings 176 through the dielectric layer 174 to the metallization pattern 170. In particular, the conductive vias 185 extend into the recesses 172 of the conductive vias 171. Further, as a result of the gap-filling plating process, the pads 184 do not have as deep of recesses 186 as other vias in the stacked via structure 132, and may only have recesses 186 due to the underlying shape of the openings 176. The pads 184 are used to couple to subsequently formed conductive connectors and may be referred to as under bump metallurgies (UBMs).

Figure 21A:
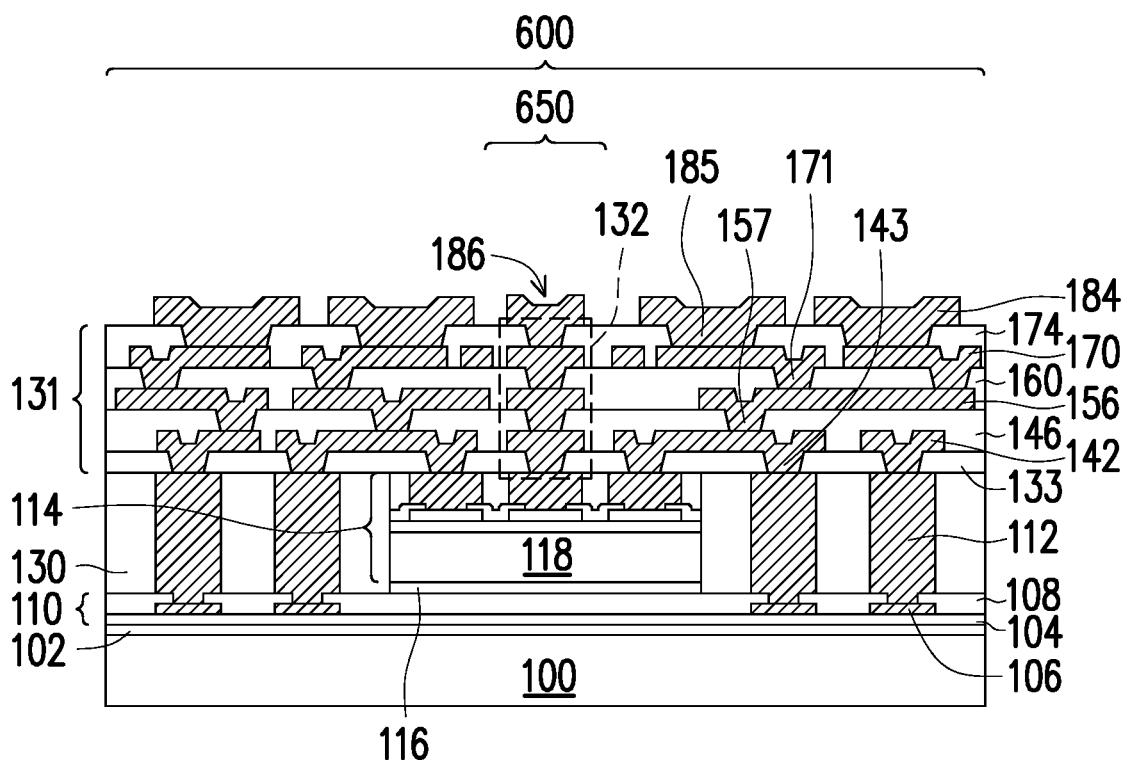
Figure 21B:
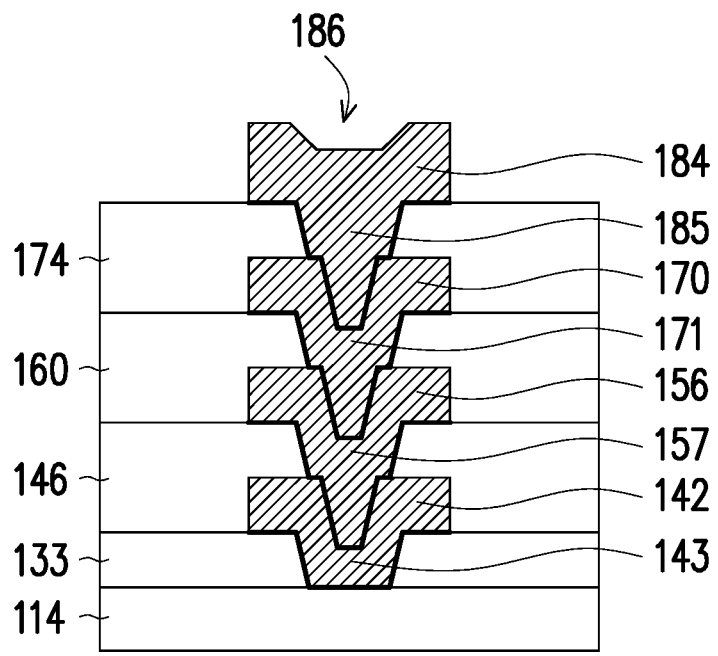

In FIGS. 21A and 21B, the photo resist 180 and portions of the seed layer 178 on which the conductive material is not formed are removed. The photo resist 180 may be removed by an acceptable ashing or stripping process, such as using an oxygen plasma or the like. Once the photo resist 180 is removed, exposed portions of the seed layer 178 are removed, such as by using an acceptable etching process, such as by wet or dry etching.

The front-side redistribution structure 131 and stacked via structure 132 are shown as an example. More or fewer dielectric layers and metallization patterns may be formed in the front-side redistribution structure 131. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 22:
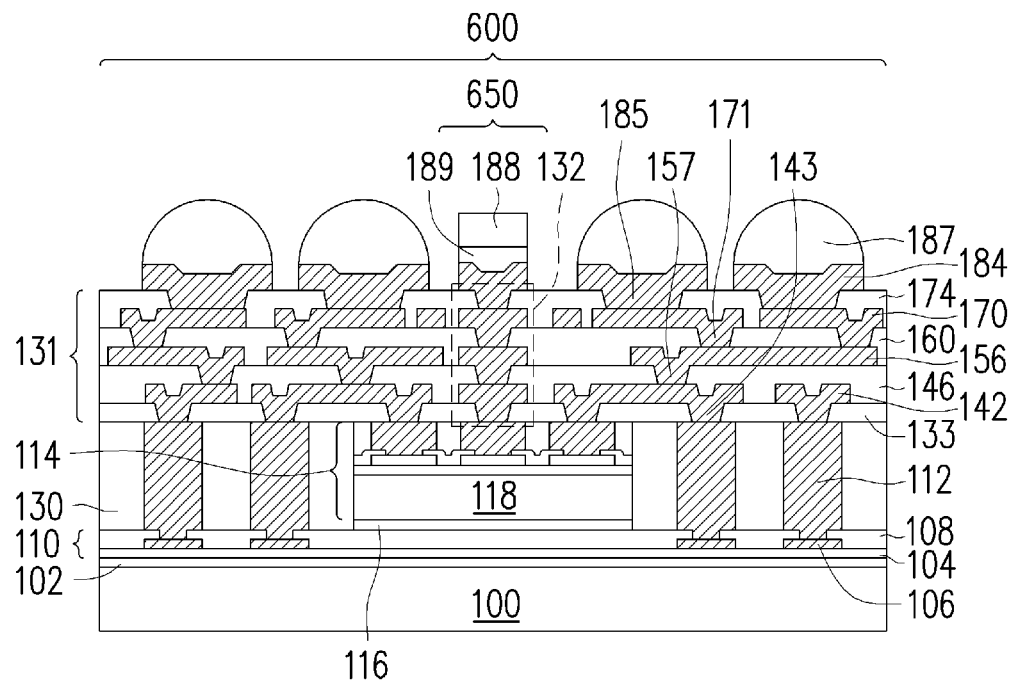

In FIG. 22, conductive connectors 187 are formed on the pads 184. The conductive connectors 187 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 187 may include a conductive material such as solder, copper, aluminum, gold, nickel, silver, palladium, tin, the like, or a combination thereof. In some embodiments, the conductive connectors 187 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 187 are metal pillars (such as a copper pillar) formed by a sputtering, printing, electro plating, electroless plating, CVD, or the like. The metal pillars may be solder free and have substantially vertical sidewalls. In such embodiments, a metal cap layer (not shown) may be formed on the top of the conductive connectors 187. The metal cap layer may include nickel, tin, tin-lead, gold, silver, palladium, indium, nickel-palladium-gold, nickel-gold, the like, or a combination thereof and may be formed by a plating process.

Further, an integrated passive device (IPD) 188 is attached to the front-side redistribution structure 131. The IPD 188 is electrically connected to the stacked via structure 132, and the stacked via structure 132 may be electrically connected to the integrated circuit die 114. In an embodiment, the bottommost via (e.g., metallization pattern 142) of the stacked via structure 132 is electrically and physically connected to one of the die connectors 126 of the integrated circuit die 114, and the topmost via (e.g., pad 184) of the stacked via structure 132 is electrically and physically connected to the IPD 188.

Before being bonded to the front-side redistribution structure 131, the IPD 188 may be processed according to applicable manufacturing processes. For example, the IPD 188 may comprise one or more passive devices in a main structure of the IPD 188. The main structure could include a substrate and/or encapsulant. In the embodiments including a substrate, the substrate could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. The passive devices may be formed in and/or on the semiconductor substrate and/or within the encapsulant and may be interconnected by interconnect structures formed by, for example, metallization patterns in one or more dielectric layers on the main structure to form the IPD 188. The IPD 188 may be a surface mount device (SMD), a 2-terminal IPD, a multi-terminal IPD, or other type of passive device. The IPD 188 is electrically and physically connected to the pad 184 of the stacked via structure 132 with conductive connectors 189, thereby coupling the front-side redistribution structure 131 to the IPD 188. The conductive connectors 189 may be similar to the conductive connectors 187, or may be different.

Figure 23:
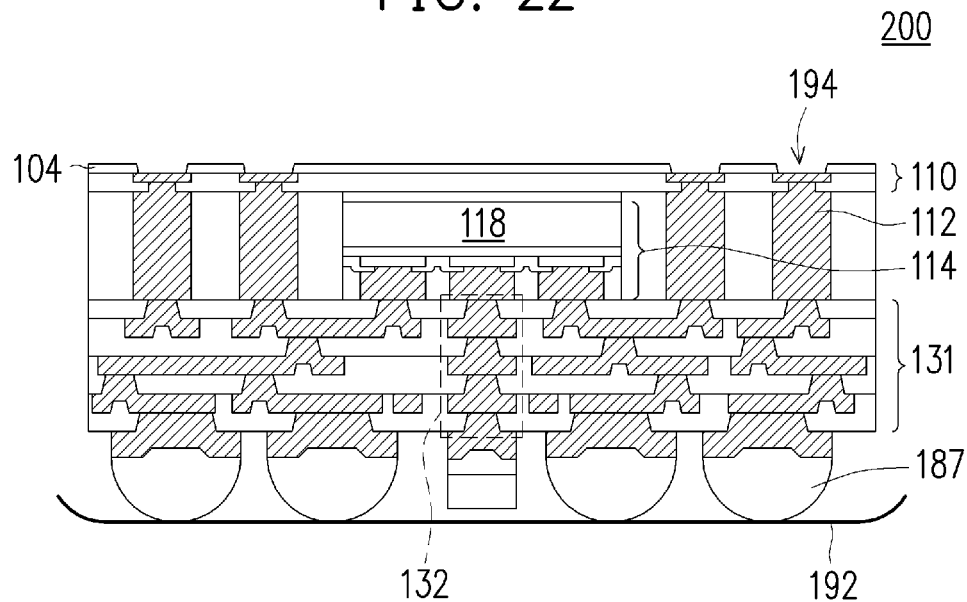

In FIG. 23, a carrier substrate de-bonding is performed to detach (de-bond) the carrier substrate 100 from the backside redistribution structure 110, e.g., the dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 192.

Further, openings 194 are formed through the dielectric layer 104 to expose portions of the metallization pattern 106. The openings may be formed, for example, using laser drilling, etching, or the like.

Figure 24:
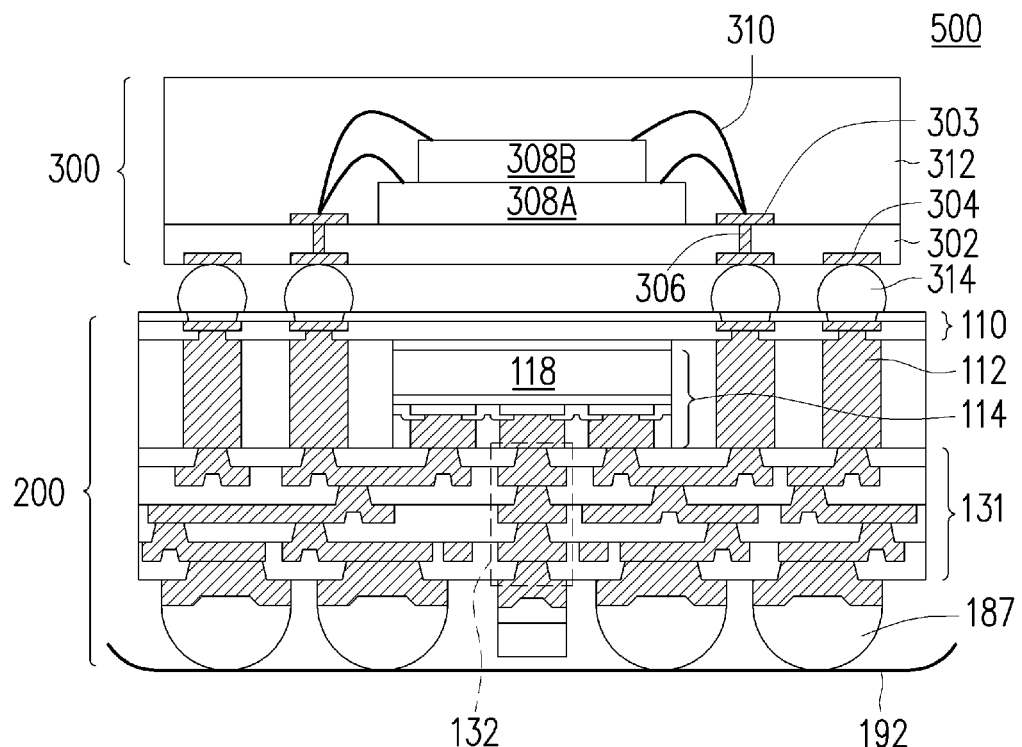
FIGS. 24 through 26 illustrate cross-sectional views of intermediate steps during a process for forming a package structure, in accordance with some embodiments.
Figure 25:
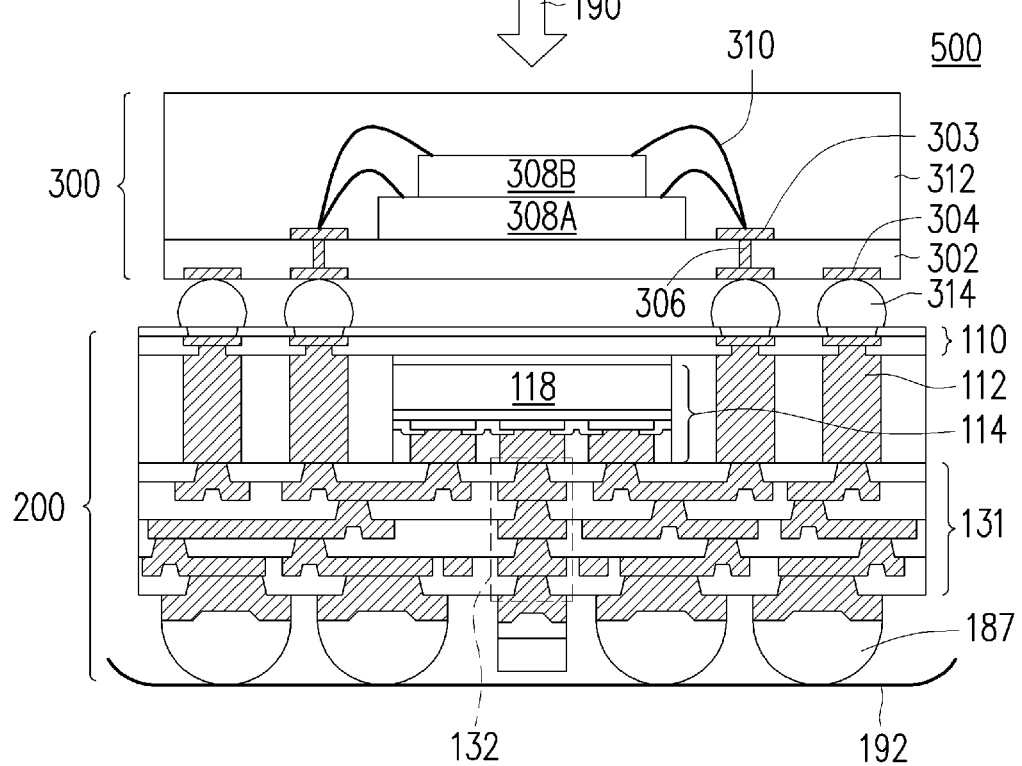
Figure 26:
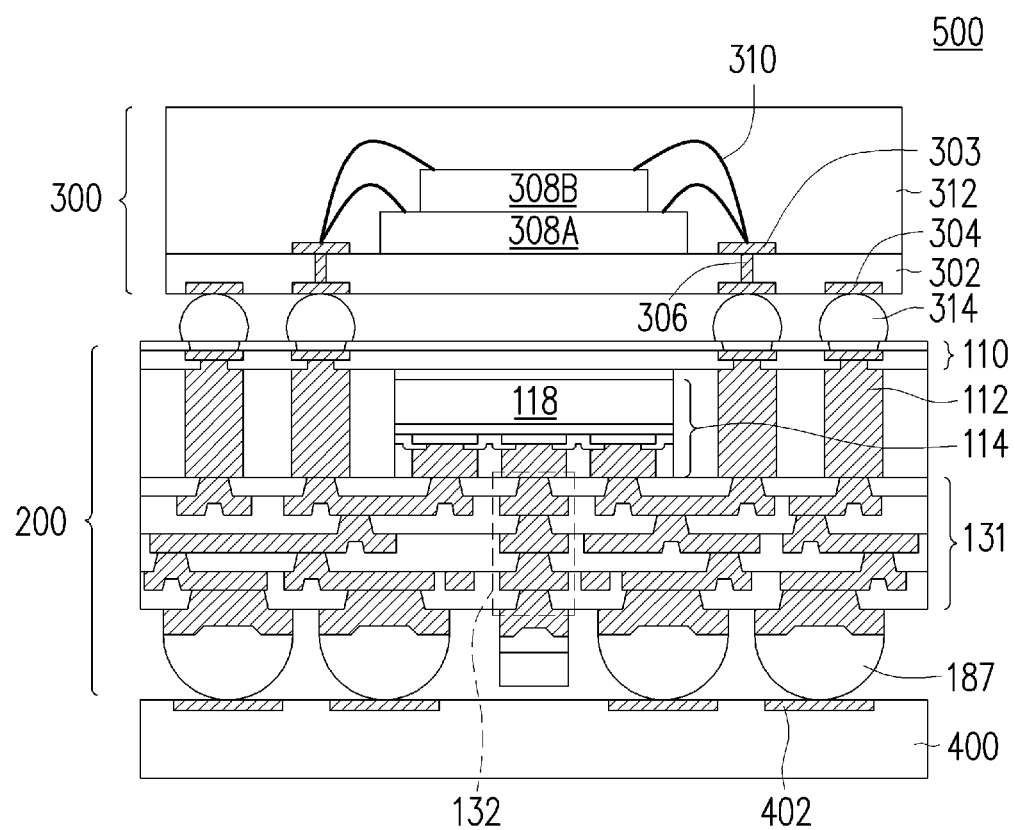

FIGS. 24 through 26 illustrate cross-sectional views of intermediate steps during a process for forming a package structure 500, in accordance with some embodiments. The package structure 500 may be referred to a package-on-package (PoP) structure.

In FIG. 24, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the functional connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of functional connectors 314, the bond pads 304, and the metallization pattern 106. In some embodiments, the stacked dies 308 may be coupled to the integrated circuit dies 114 through the wire bonds 310, the bond pads 303 and 304, through vias 306, the functional connectors 314, and the through vias 112.

The functional connectors 314 may be similar to the conductive connectors 187 described above and the description is not repeated herein, although the functional connectors 314 and the conductive connectors 187 need not be the same. The functional connectors 314 may be disposed on an opposing side of the substrate 302 as the stacked dies 308, in the openings 194. In some embodiments, a solder resist 318 may also be formed on the side of the substrate 302 opposing the stacked dies 308. The functional connectors 314 may be disposed in openings in the solder resist 318 to be electrically and mechanically coupled to conductive features (e.g., the bond pads 304) in the substrate 302. The solder resist 318 may be used to protect areas of the substrate 302 from external damage.

In some embodiments, before bonding the functional connectors 314, the functional connectors 314 are coated with a flux (not shown), such as a no-clean flux. The functional connectors 314 may be dipped in the flux or the flux may be jetted onto the functional connectors 314. In another embodiment, the flux may be applied to the surfaces of the metallization patterns 106.

In some embodiments, the functional connectors 314 may have an optional epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the functional connectors 314.

An underfill (not shown) may be formed between the first package 200 and the second package 300 and surrounding the functional connectors 314. The underfill may be formed by a capillary flow process after the first package 200 is attached or may be formed by a suitable deposition method before the first package 200 is attached.

The bonding between the second package 300 and the first package 200 may be a solder bonding. In an embodiment, the second package 300 is bonded to the first package 200 by a reflow process. During this reflow process, the functional connectors 314 are in contact with the bond pads 304 and the metallization patterns 106 to physically and electrically couple the second package 300 to the first package 200. After the bonding process, an intermetallic compound (IMC, not shown) may form at the interface of the metallization patterns 106 and the functional connectors 314 and also at the interface between the functional connectors 314 and the bond pads 304 (not shown).

In FIG. 25, a singulation process is performed by sawing 190 along scribe line regions e.g., between adjacent package regions. The sawing 190 singulates the first package region 600 from other package regions (not shown). The resulting, singulated first package 200 is from the first package region 600.

In FIG. 26, the first package 200 is mounted to a package substrate 400 using the conductive connectors 187. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 187 are reflowed to attach the first package 200 to the bond pads 402. The conductive connectors 187 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 187.

The conductive connectors 187 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 187. In some embodiments, an underfill (not shown) may be formed between the first package 200 and the package substrate 400 and surrounding the conductive connectors 187. The underfill may be formed by a capillary flow process after the first package 200 is attached or may be formed by a suitable deposition method before the first package 200 is attached.

FIGS. 27 through 42 illustrate formation of the stacked via structure 132, in accordance with some other embodiments. FIGS. 27 through 42 illustrate the region 650. In the embodiment of FIGS. 27 through 42, the vias of the stacked via structure 132 are formed around conductive pillars.

Figure 27:
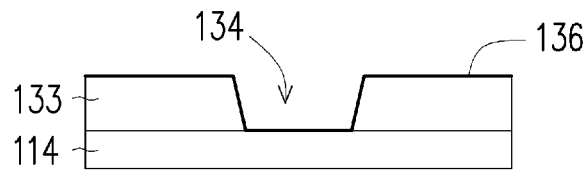
FIGS. 27 through 42 illustrate formation of a stacked via structure, in accordance with some other embodiments.

In FIG. 27, the dielectric layer 133 is deposited on the encapsulant 130, through vias 112, and integrated circuit dies 114 (e.g., die connectors 126). The dielectric layer 133 is then patterned to form openings 134. The seed layer 136 is then formed over the dielectric layer 133 and in the openings 134 extending through the dielectric layer 133.

Figure 28:
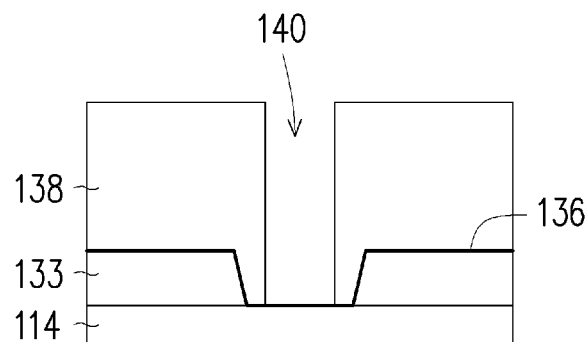

In FIG. 28, the photo resist 138 is formed and patterned on the seed layer 136. The photo resist 138 is then patterned, forming openings 140 through the photo resist 138 that expose the seed layer 136. The width of the openings 140 is less than the width of the openings 134.

Figure 29:
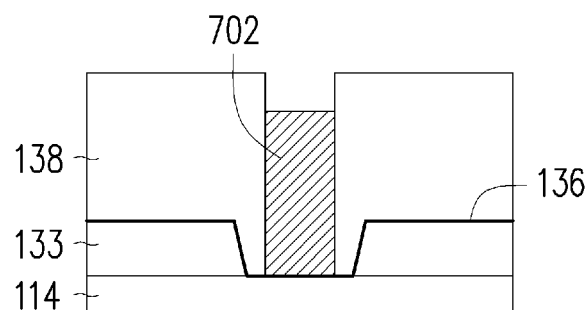

In FIG. 29, a conductive material is formed on the exposed portions of the seed layer 136. The conductive material may be formed by plating, such as electroplating or electroless plating, or the like. The conductive material may comprise a metal, like copper, titanium, tungsten, aluminum, or the like. The combination of the conductive material and underlying portions of the seed layer 136 form a conductive pillar 702.

Figure 30:
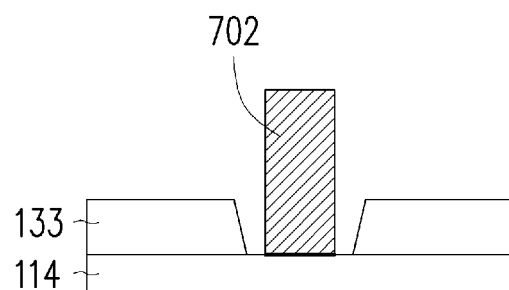

In FIG. 30, the photo resist 138 and portions of the seed layer 136 on which the conductive material is not formed are removed.

Figure 31:
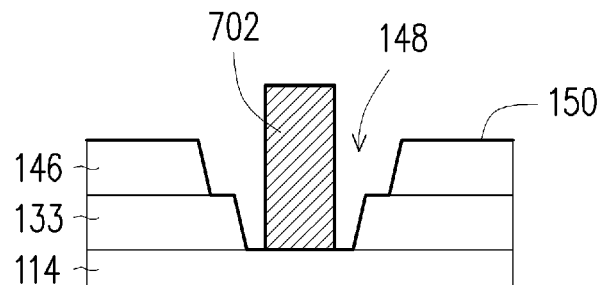

In FIG. 31, the dielectric layer 146 is deposited on the dielectric layer 133 and around the conductive pillar 702. The dielectric layer 146 is then patterned. The patterning forms the openings 148 to expose the openings 134. The seed layer 150 is then formed over the dielectric layer 146, in the openings 148 through the dielectric layer 146, and in the openings 134 through the dielectric layer 133. The seed layer 150 extends along sides of the conductive pillar 702.

Figure 32:
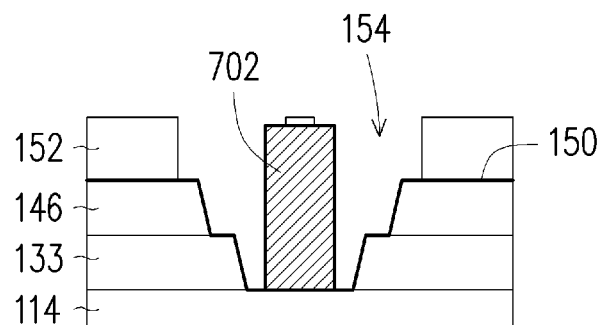

In FIG. 32, the photo resist 152 is formed and patterned on the seed layer 150. The patterning forms the openings 154 through the photo resist to expose the seed layer 150. The openings 154 surround the conductive pillar 702. Portions of the patterned photo resist 152 are disposed over the conductive pillar 702.

Figure 33:
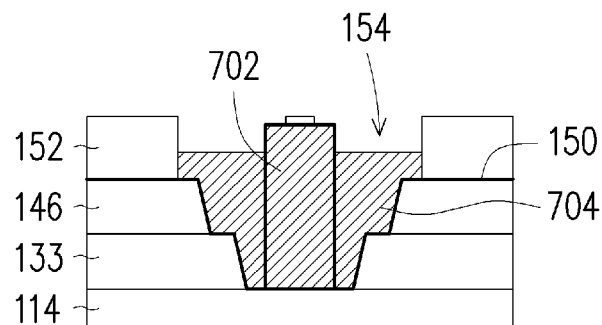

In FIG. 33, a conductive material is formed on the exposed portions of the seed layer 150. The conductive material may be formed by plating, such as electroplating or electroless plating, or the like. The conductive material may comprise a metal, like copper, titanium, tungsten, aluminum, or the like. The combination of the conductive material and underlying portions of the seed layer 150 form a conductive via 704 around the conductive pillar 702. The conductive via 704 extends through both dielectric layers 133 and 146.

Figure 34:
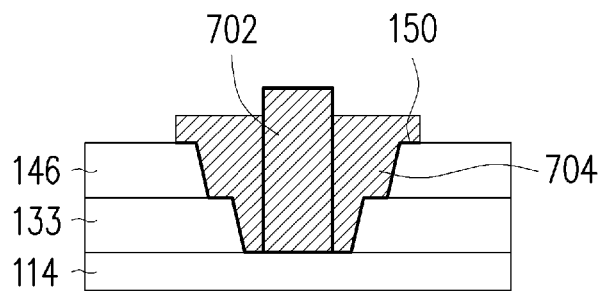

In FIG. 34, the photo resist 152 and portions of the seed layer 150 on which the conductive material is not formed are removed.

Figure 35:
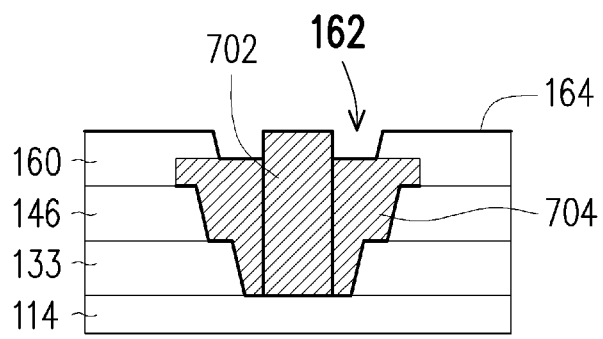

In FIG. 35, the dielectric layer 160 is deposited on the dielectric layer 146 and the conductive via 704. The dielectric layer 160 is then patterned. The patterning forms the openings 162 to expose portions of the conductive via 704 and conductive pillar 702. The seed layer 164 is then formed over the dielectric layer 160, in the openings 162 through the dielectric layer 160. The seed layer 164 extends along the sidewalls and the top surface of the conductive pillar 702.

Figure 36:
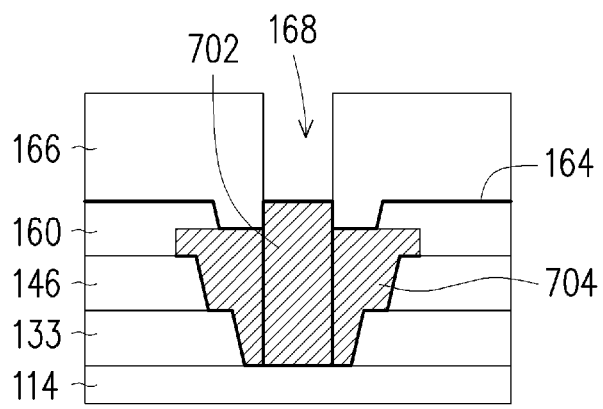

In FIG. 36, the photo resist 166 is formed and patterned on the seed layer 164. The patterning forms the openings 168 through the photo resist to expose the seed layer 164. The openings 168 are over the conductive pillar 702, and may have a width that is about equal to the width of the conductive pillar 702.

Figure 37:
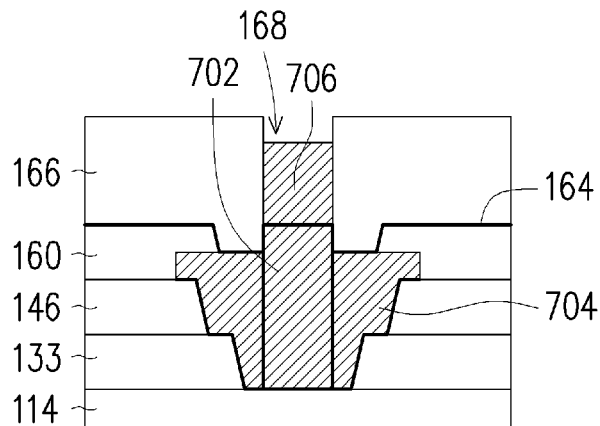

In FIG. 37, a conductive material is formed on the exposed portions of the seed layer 164. The conductive material may be formed by plating, such as electroplating or electroless plating, or the like. The conductive material may comprise a metal, like copper, titanium, tungsten, aluminum, or the like. The combination of the conductive material and underlying portions of the seed layer 164 form a conductive pillar 706 on the conductive pillar 702.

Figure 38:
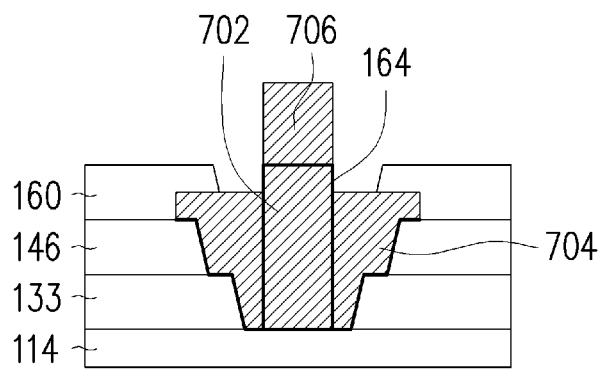

In FIG. 38, the photo resist 166 and portions of the seed layer 164 on which the conductive material is not formed are removed. Portions of the seed layer 164 along the sidewalls and the top surface of the conductive pillar 702 are not removed.

Figure 39:
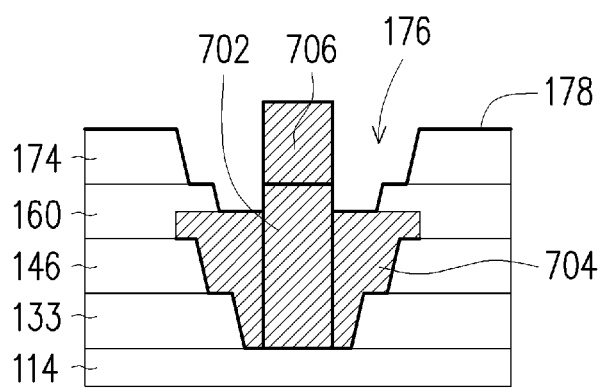

In FIG. 39, the dielectric layer 174 is deposited on the dielectric layer 160 and the conductive via 704, and around the conductive pillars 702 and 706. The dielectric layer 174 is patterned. The patterning forms the openings 176 to expose portions of the conductive via 704 and conductive pillars 702 and 706. The seed layer 178 is then formed over the dielectric layer 174 and in the openings 176 through the dielectric layer 174. The seed layer 178 extends along sidewalls of the conductive pillars 702 and 706, and along the top surface of the conductive pillar 706.

Figure 40:
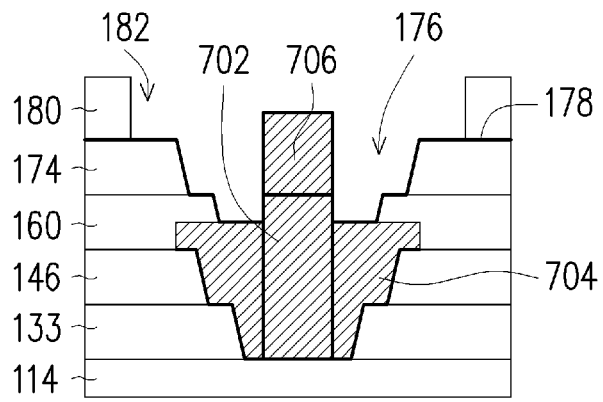

In FIG. 40, the photo resist 180 is formed and patterned on the seed layer 178. The patterning forms the openings 182 through the photo resist 180 to expose the seed layer 178. The openings 182 are over the conductive pillars 702 and 706.

Figure 41:
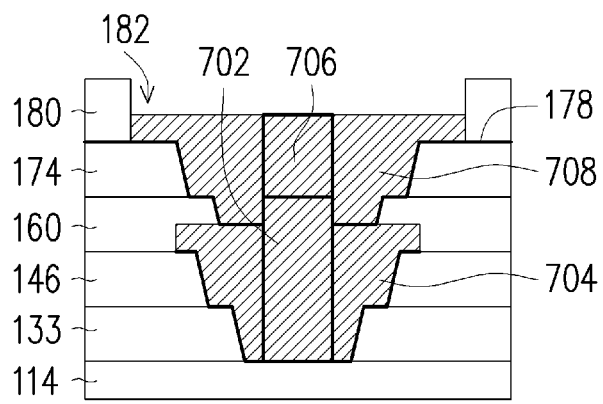

In FIG. 41, a conductive material is formed on the exposed portions of the seed layer 178. The conductive material may be formed by plating, such as electroplating or electroless plating, or the like. The conductive material may comprise a metal, like copper, titanium, tungsten, aluminum, or the like. The combination of the conductive material and underlying portions of the seed layer 178 form the pad 184, which includes a conductive via 708 around the conductive pillars 702 and 706. The conductive via 708 extends through both dielectric layers 160 and 174. The conductive via 708 may extend over the conductive pillars 702 and 706.

Figure 42:
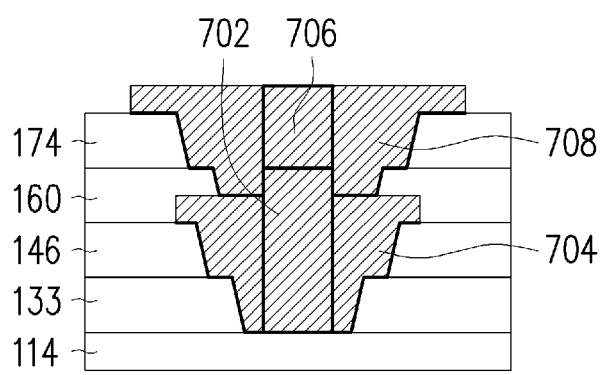

In FIG. 42, the photo resist 180 and portions of the seed layer 178 on which the conductive material is not formed are removed.

Embodiments may achieve advantages. By offsetting the interface of the dielectric layers 133 and 146 from the multiple interfacial planes of the metallization patterns 142 and 156, further package stress concentration may be avoided, thereby reducing the chances of cracks forming at the interface of the metallization patterns 142 and 156. Further, the seed layers 136, 150, 164, and 178 may act as a diffusion blocking layer between adjacently stacked vias. In embodiments where the conductive pillars 702 and 706 are formed, they may act as a core structure, strengthening the stacked via structure 132.

In an embodiment, a device includes: a molding compound; an integrated circuit die encapsulated in the molding compound; a through via adjacent the integrated circuit die; and a redistribution structure over the integrated circuit die, the molding compound, and the through via, the redistribution structure electrically connected to the integrated circuit die and the through via, the redistribution structure including: a first dielectric layer disposed over the molding compound; a first conductive via extending through the first dielectric layer; a second dielectric layer disposed over the first dielectric layer and the first conductive via; and a second conductive via extending through the second dielectric layer and into a portion of the first conductive via, an interface between the first conductive via and the second conductive via being non-planar.

In some embodiments, an interface between the first conductive via and the second conductive via has a first portion lying in a first plane and a second portion lying in a second plane, the first plane proximate the integrated circuit die, the second plane distal the integrated circuit die, and an interface between the first dielectric layer and the second dielectric layer lies in a third plane between the first plane and the second plane. In some embodiments, the redistribution structure further includes: a third dielectric layer over the second dielectric layer and the second conductive via; and a third conductive via extending through the third dielectric layer and into a portion of the second conductive via, an interface between the second conductive and the third conductive via being non-planar. In some embodiments, the device further includes: an integrated passive device (IPD) attached to the third conductive via.

In an embodiment, a method includes: encapsulating an integrated circuit die in a molding compound, the integrated circuit die having a die connector; depositing a first dielectric layer over the molding compound; patterning an first opening through the first dielectric layer exposing the die connector of the integrated circuit die; depositing a first seed layer over the first dielectric layer and in the first opening; plating a first conductive via extending through the first dielectric layer on the first seed layer, the first conductive via having a first recess in portions of the first conductive via extending through the first dielectric layer; depositing a second dielectric layer over the first dielectric layer and the first conductive via; patterning a second opening in the second dielectric layer, the second opening exposing the first recess of the first conductive via; depositing a second seed layer over the second dielectric layer, in the second opening, and in the first recess; and plating a second conductive via on the second seed layer, the second conductive via extending into the first recess of the first conductive via and through the second dielectric layer, the second conductive via having a second recess in portions of the second conductive via extending through the second dielectric layer.

In some embodiments, the second seed layer has a first portion lying in a first plane and a second portion lying in a second plane, a second interface between the first dielectric layer and the second dielectric layer lies in a third plane, and the first plane is proximate the integrated circuit die, the second plane is distal the integrated circuit die, and the third plane is between the first plane and the second plane. In some embodiments, the second seed layer extends along a top surface of the second dielectric layer, sides of the second opening, a topmost surface of the first conductive via, portions of the first conductive via defining sides of the first recess, and portions of the first conductive via defining a bottom of the first recess. In some embodiments, an interface between the second dielectric layer and the second seed layer is non-planar. In some embodiments, the method further includes: depositing a third dielectric layer over the second dielectric layer and the second conductive via; patterning a third opening in the third dielectric layer, the third opening exposing the second recess of the second conductive via; depositing a third seed layer over the third dielectric layer, in the third opening, and in the second recess; and plating a third conductive via on the third seed layer, the third conductive via extending into the second recess of the second conductive via and through the third dielectric layer. In some embodiments, the second conductive via extends through the second dielectric layer, and extends at least partially into the first dielectric layer and the third dielectric layer. In some embodiments, the method further includes: attaching an integrated passive device (IPD) to the third conductive via. In some embodiments, the plating the third conductive via on the second seed layer is performed with a gap-filling plating process. In some embodiments, the gap-filling plating process includes a plating process performed with a plating current density of from 2.0 A/dm$^2$ to 6.0 A/dm$^2$, and a plating solution comprising copper sulfate. In some embodiments, the plating the second conductive via on the second seed layer is performed with a conformal plating process. In some embodiments, the conformal plating process includes a plating process performed with a plating current density of from 0.3 A/dm$^2$ to 0.9 A/dm$^2$, and a plating solution comprising copper sulfate.

In an embodiment, a method includes: encapsulating an integrated circuit die in a molding compound, the integrated circuit die having a die connector; depositing a first dielectric layer over the molding compound; patterning an first opening through the first dielectric layer; forming a first conductive pillar in the first opening on the die connector of the integrated circuit die; depositing a second dielectric layer over the first dielectric layer; patterning a second opening in the second dielectric layer, the second opening exposing the first opening; and forming a first conductive via around the first conductive pillar in the first opening and the second opening.

In some embodiments, the method further includes: depositing a third dielectric layer over the second dielectric layer; patterning a third opening in the third dielectric layer, the third opening exposing the first conductive via; forming a second conductive pillar in the third opening on the first conductive pillar; depositing a fourth dielectric layer over the third dielectric layer; patterning a fourth opening in the fourth dielectric layer, the fourth opening exposing the third opening; and forming a second conductive via around the second conductive pillar in the third opening and the fourth opening. In some embodiments, the method further includes: attaching an integrated passive device (IPD) to the second conductive via. In some embodiments, after the third dielectric layer is deposited, the first conductive via extends through the first dielectric layer, through the second dielectric layer, and partially into the third dielectric layer. In some embodiments, the second conductive via is further formed around the first conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
an integrated circuit die comprising a die connector;
a molding compound encapsulating the integrated circuit die;
a first dielectric layer over the molding compound;
a second dielectric layer over the first dielectric layer;
a first conductive pillar extending through the second dielectric layer and the first dielectric layer, the first conductive pillar contacting the die connector; and
a first conductive via around the first conductive pillar, the first conductive via extending through the second dielectric layer and the first dielectric layer.

2. The device of claim 1, wherein the first conductive pillar has a greater height than the first conductive via.

3. The device of claim 1, wherein a top surface of the first conductive pillar is disposed further from the die connector than the top surface of the second dielectric layer.

4. The device of claim 1, further comprising:
a third dielectric layer over the second dielectric layer; and
a second conductive pillar in the third dielectric layer, the second conductive pillar contacting the first conductive pillar.

5. The device of claim 4, further comprising:
a second conductive via around the second conductive pillar, the second conductive via extending through the third dielectric layer.

6. The device of claim 5, further comprising:
a fourth dielectric layer between the second and third dielectric layers, the second conductive pillar and the second conductive via extending through the fourth dielectric layer.

7. The device of claim 5, further comprising:
an integrated passive device (IPD) coupled to the second conductive via.

8. The device of claim 5, wherein the second conductive via is around the first conductive pillar.

9. The device of claim 5, wherein the second conductive via is over the second conductive pillar.

10. The device of claim 5, further comprising:
a seed layer on the first conductive via, the seed layer disposed between a first conductive material of the first conductive via and a second conductive material of the second conductive via.

11. A device comprising:
a first dielectric layer on a first conductive feature;
a first conductive pillar disposed on the first conductive feature;
a second dielectric layer on the first dielectric layer; and
a first conductive via disposed on the first conductive feature and around the first conductive pillar.

12. The device of claim 11, wherein the first conductive feature is a die connector of an integrated circuit die.

13. The device of claim 11, wherein the first conductive via is further disposed over the first conductive pillar.

14. The device of claim 11, further comprising:
an integrated passive device (IPD) coupled to the first conductive via.

15. The device of claim 11, wherein the first conductive feature comprises a second conductive pillar and a second conductive via, the second conductive via disposed around the second conductive pillar.

16. The device of claim 15, wherein the first conductive via is further disposed around the second conductive pillar.

17. The device of claim 15, wherein the second conductive pillar has a greater height than the second conductive via.

18. A device comprising:
a first dielectric layer on a die connector;

a first conductive pillar in first dielectric layer, the first conductive pillar being electrically coupled to the die connector;
a second dielectric layer on the first dielectric layer; and
a first conductive via in the first and second dielectric layers, the first conductive via disposed on the die connector and around the first conductive pillar.

19. The device of claim 18, further comprising:
a third dielectric layer over the second dielectric layer;
a fourth dielectric layer over the third dielectric layer;
a second conductive pillar in the fourth dielectric layer, the second conductive pillar contacting the first conductive pillar; and
a second conductive via around the second conductive pillar, the second conductive via in the third and fourth dielectric layers.

20. The device of claim 19, wherein the second conductive via is around the first conductive pillar.

* * * * *